US011846041B2

(12) United States Patent
Kim et al.

(10) Patent No.: US 11,846,041 B2
(45) Date of Patent: Dec. 19, 2023

(54) PASSIVATION OF NANOCRYSTALS TAILORED TO DIFFERENT FACETS, AND ITS APPLICATION TO OPTOELECTRONIC DEVICES

(71) Applicant: QD SOLAR INC., Toronto (CA)

(72) Inventors: Younghoon Kim, Daegu (KR); Fanglin Che, Newark, DE (US); Jea Woong Jo, Seoul (KR); Jongmin Choi, Daegu (KR); Francisco Pelayo Garcia De Arquer, Toronto (CA); Sjoerd Hoogland, Toronto (CA); Edward H. Sargent, Toronto (CA)

(73) Assignee: QD SOLAR INC., Toronto (CA)

( * ) Notice: Subject to any disclaimer, the term of this patent is extended or adjusted under 35 U.S.C. 154(b) by 209 days.

(21) Appl. No.: 17/055,052

(22) PCT Filed: May 14, 2019

(86) PCT No.: PCT/CA2019/050648
§ 371 (c)(1),
(2) Date: Nov. 12, 2020

(87) PCT Pub. No.: WO2019/218060
PCT Pub. Date: Nov. 21, 2019

(65) Prior Publication Data
US 2021/0222326 A1    Jul. 22, 2021

Related U.S. Application Data

(60) Provisional application No. 62/671,145, filed on May 14, 2018.

(51) Int. Cl.
*C30B 29/46* (2006.01)
*C01G 21/21* (2006.01)
(Continued)

(52) U.S. Cl.
CPC .............. *C30B 29/46* (2013.01); *C01G 21/21* (2013.01); *C30B 33/00* (2013.01);
(Continued)

(58) Field of Classification Search
CPC ...................................................... C30B 29/46
See application file for complete search history.

(56) References Cited

U.S. PATENT DOCUMENTS

| 9,343,871 B1 * | 5/2016 | Raring | ............. H01S 5/320275 |
| 2009/0081857 A1 * | 3/2009 | Hanser | .................. C30B 29/406 257/E21.108 |

OTHER PUBLICATIONS

Kim et al., "A Facet-Specific Quantum Dot Passivation Strategy for Colloid Management and Efficient Infrared Photovoltaics", Advanced Materials, DOI: 10.1002/adma.201805580, Revised: Feb. 24, 2019, Published online: Mar. 12, 2019, 8 pages.
(Continued)

*Primary Examiner* — William D Young
(74) *Attorney, Agent, or Firm* — HILL & SCHUMACHER

(57) ABSTRACT

The present disclosure provides a method for facet-selective passivation on each crystal facet of colloidal nanocrystals via solution-phase ligand exchange process, thereby providing highly-passivated and colloidally-stable nanocrystal inks. This ligand exchange strategy separately addresses polar and non-polar facets precluding from deleterious nanocrystal aggregation in the colloid. The method involves the introduction of alkali metal organic complexes during metal halide conventional solution exchanges, and one specific example is $Na^+ \cdot Ac^-$. Alkali metal ions stabilize and passivate non polar facets whereas polar facets are passivated through metal halides. This strategy leads to a significant decrease in nanocrystal aggregation during and after ligand exchange, and to improved photophysical properties stemming from this. The resulting nanocrystal solid films exhibit improved stability, retain their absorption features, and have a minimized Stokes shift.

23 Claims, 26 Drawing Sheets

(51) Int. Cl.
  *C30B 33/00* (2006.01)
  *H01L 31/0296* (2006.01)
  *H01L 31/036* (2006.01)
  *H01L 31/18* (2006.01)
  *B82Y 20/00* (2011.01)
  *B82Y 40/00* (2011.01)

(52) U.S. Cl.
  CPC ........ H01L 31/0296 (2013.01); H01L 31/036 (2013.01); H01L 31/1868 (2013.01); *B82Y 20/00* (2013.01); *B82Y 40/00* (2013.01); *C01P 2002/85* (2013.01); *C01P 2004/04* (2013.01); *C01P 2004/64* (2013.01); *C01P 2006/40* (2013.01)

(56) References Cited

OTHER PUBLICATIONS

Bederak et al., "Comparing Halide Ligands in PbS Colloidal Quantum Dots for Field-Effect Transistors and Solar Cells", ACS Appl. Nano Mater., 2018, 1, 6882-6889.

Zherebetskyyl et al., "Hydroxylation of the surface of PbS nanocrystals passivated with oleic acid", Science 29, May 2011, DOI: 10.1126/science 1252727, 16 pages.

Balazs, D. M. et al., "Counterion-mediated ligand exchange for PbS colloidal quantum dot superlattices", ACS Nano 9, 11951-11959, (2015).

Dong, A. et al., "A generalized ligand exchange strategy enabling sequential surface functionalization of colloidal nanocrystals", J. Am. Chem. Soc., 133, 998-1006, (2011).

International Search Report dated Sep. 10, 2019, for the parent PCT/CA2019/050648 filed May 14, 2019.

* cited by examiner

| 1142 nm CQDs | Concentration (ug/mL) | | Atomic Ratio | |
| --- | --- | --- | --- | --- |
| | Na | Pb | Na | Pb |
| As-prepared | 5.11 | 100.2 | 0.0510 | 1 |
| 1 wash with DMF | 5.10 | 99.1 | 0.0493 | 1 |
| 2 wash with DMF | 5.13 | 100.0 | 0.0513 | 1 |

FIG. 8A

| Sample | Concentration (ug/mL) | | Atomic Ratio | |
| --- | --- | --- | --- | --- |
| | Na | Pb | Na | Pb |
| 1072 nm | 6.68 | 168.3 | 0.0397 | 1 |
| 1142 nm | 5.11 | 103.6 | 0.0510 | 1 |
| 1272 nm | 7.72 | 91.4 | 0.0845 | 1 |

FIG. 8B

| | | $V_{oc}$ (V) | $J_{sc}$ (mA/cm²) | FF (%) | PCE (%) |
|---|---|---|---|---|---|
| A·Ac 0.2 mmol | Unfiltered | 0.49 | 24.37 | 50.76 | 6.01 |
| | Si filtered (1100 nm) | 0.38 | 2.60 | 61.29 | 0.60 |
| A·Ac 0.3 mmol | Unfiltered | 0.45 | 24.07 | 47.68 | 5.16 |
| | Si filtered (1100 nm) | 0.34 | 2.31 | 56.33 | 0.44 |
| A·Ac 0.4 mmol | Unfiltered | 0.39 | 23.80 | 45.86 | 4.26 |
| | Si filtered (1100 nm) | 0.28 | 2.22 | 55.65 | 0.35 | a
PASSIVATION OF NANOCRYSTALS TAILORED TO DIFFERENT FACETS, AND ITS APPLICATION TO OPTOELECTRONIC DEVICES

FIELD

The present disclosure relates to a method of the passivation of nanocrystals wherein different coverages, passivant compositions, and/or binding motifs are applied to distinct classes of facets; and its application to optoelectronic devices and in particular for photovoltaic devices.

BACKGROUND

Controlling the size and facets of colloidal nanocrystals from synthesis all the way to the film phase is critical to exploit their features in optoelectronic devices. This is especially important as different sized nanocrystals exhibit different optical and electrical properties, which can address different applications. As an example, large-diameter (>3.5 nm) lead sulfide (PbS) nanocrystals offer the attractive possibility to harvest infrared (IR) solar energy beyond silicon photovoltaics, but these nanocrystals exhibit different facets compared to smaller diameter, larger-bandgap nanocrystals; and the materials chemistry of the smaller nanocrystals fails to translate in the important short-wavelength IR regime.

Colloidal nanocrystals including metals, semiconductors and ceramics have been developed through advances in surface and colloid chemistry. They have inspired intense interest in technological applications due to their size-dependent features and excellent processability[1-10].

The surface structure of colloidal nanocrystals is sensitive to crystal size. The complex surface structure that emerges immediately following nanocrystal synthesis[11-16] has seen extensive study; but is underexplored in the post-synthetic processes responsible for assembling colloidal nanocrystals into semiconductor thin films[15,17].

As the nanocrystal size changes, the relative contribution of different facets varies, exhibiting different polarity and affinity for capping ligands[18-20]. As an example, in PbS nanocrystals, oleic acid is more weakly bound to the nonpolar (100) facet compared to the (111) facet[21-23]: indeed it detaches readily from the (100) facet in polar solvents. This property, exploited in large-diameter nanocrystals to form locally-ordered superstructures via (100) facet assembly[24-27], produces nanocrystal aggregation during solution-phase colloid materials processing.

It would be advantageous to provide a colloidal ligand passivation strategy that separately addressed different facets of a nanocrystal.

SUMMARY OF THE INVENTION

The present disclosure provides a method for facet-selective passivation on each crystal facet of colloidal nanocrystals via solution-phase ligand exchange process, thereby providing highly-passivated and colloidally-stable nanocrystal inks. This ligand exchange strategy separately addresses polar and non-polar facets precluding from deleterious nanocrystal aggregation in the colloid. The method involves the introduction of alkali metal organic complexes during metal halide conventional solution exchanges, and one specific example is sodium acetate ($Na^+ \cdot Ac^-$). Alkali metal ions stabilize and passivate non polar facets whereas polar facets are passivated through metal halides. This strategy leads to a significant decrease in nanocrystal aggregation during and after ligand exchange, and to improved photophysical properties stemming from this. The resulting nanocrystal solid films exhibit improved stability, retain their absorption features, and have a minimized Stokes shift.

As a non-limiting example, the inventors implemented a sodium acetate ($Na^+ \cdot Ac^-$) exchange strategy that, applied to PbS nanocrystals leads to improve photophysical properties and device performance. This is supported by extensive material characterization, photophysical measurements, computational simulations and device performance. The results clearly show this strategy significantly enhances solar cell performance, leading to 33% and 48% increases in power conversion efficiency (PCE) under full and 1100 nm-filtered solar spectrum respectively, leading to the largest addition (~1% PCE) of solar power points atop silicon's photovoltaic performance, compared to the lead halide-only passivated nanocrystals following the conventional ligand exchange method.

Thus, the present disclosure provides colloidal nanocrystal comprising at least two distinct classes of crystal facets exposed at an outer surface thereof, wherein a first class of crystal facets is substantially nonpolar, and wherein a second class of crystal facets is polar, wherein the substantially nonpolar facet is passivated by an alkali metal and the polar facet passivated by at least one halide.

The first class of crystal facets is substantially neutral in addition to being substantially nonpolar, and wherein the second class of crystal facets is substantially non-neutral in addition to being polar.

The alkali metal may be any one or combination of lithium, sodium, potassium, rubidium and cesium.

The alkali metal may be sodium.

The halide may be any one or combination of bromine, iodine and chlorine.

The halide may be a mixture of bromine and iodine.

The halide may be iodine.

The colloidal nanocrystal may be any one or combination of lead sulfide (PbS), lead selenide (PbSe) and lead telluride (PbTe). However it will be appreciated that the colloidal nanocrystals are not limited to the aforementioned nanocrystals.

The colloidal nanocrystal may be PbS and may have a size in a range from about 3 to about 10 nanometers.

The non-polar facet may be the (100) crystal facet, and the polar facet may be the (111) crystal facet.

The present disclosure provides a method of facet-selective passivation on each crystal facet of colloidal nanocrystals by solution-phase ligand exchange, comprising:

a) providing colloidal nanocrystals having one or more types of ligands attached to an outer surface of the colloidal nanocrystals, the outer surface having at least two distinct crystal facets exposed at the outer surface of the colloidal nanocrystals, one of said exposed crystal facets being a neutral and non-polar facet, at least another of said exposed crystal facets being a non-neutral and polar facet,
dispersing the colloidal nanocrystals having one or more types of ligands attached to an outer surface in an organic solvent;
b) synthesizing dual passivated colloidal nanocrystals by dissolving solutions of metal halides and alkali metal salt complexed with a moiety selected to enhance removal of original ligands on the surface of the colloidal nanocrystal in a solvent to produce a precursor solution, the solvent being selected to be immiscible with the organic solvent;

adding the colloidal nanocrystals dispersed in the organic solvent to the precursor solution to form a phase separated mixture comprised of the colloidal nanocrystals dispersed in the organic solvent and the precursor solution;

c) inducing transfer of the colloidal nanocrystals from the organic phase to the precursor solution phase by mixing the mixture such that the ligands are stripped from the outer surface of the colloidal nanocrystal and the alkali metal passivates the neutral and non-polar crystal facet, and halide passivates the non-neutral and polar crystal facet thereby producing dual-passivated nanocrystals;

d) washing the dual-passivated colloidal nanocrystals in the precursor solvent with an organic solvent in order to remove any residual original ligands thereby; and e) precipitating the dual-passivated colloidal nanocrystals by adding an anti-solvent and drying the precipitated dual-passivated colloidal nanocrystals.

The method may further comprise a step of re-dispersing the dual-passivated colloidal nanocrystals in a solvent after step e).

In the method the alkali metals may be any one or combination of lithium, sodium, potassium, rubidium and cesium.

In the method the alkali metal may be sodium.

In the method the halide may be any one or combination of bromine, iodine and chlorine.

In the method the halide may be a mixture of bromine and iodine.

In the method the halide may be iodine.

In the method the colloidal nanocrystal may be any one or combination of lead sulfide (PbS), lead selenide (PbSe) and lead telluride (PbTe).

In the method the colloidal nanocrystal is PbS, and may have a size in a range from about 3 to about 10 nanometers.

In the method the non-polar crystal facet may be the (100) crystal facet, and wherein the polar crystal facet may be the (111) crystal facet.

The alkali metal salt may be alkali metal acetate.

The present disclosure provides a method of facet-selective passivation on crystal facets of PbS colloidal nanocrystals by solution-phase ligand exchange, comprising:

a) providing PbS colloidal nanocrystals having one or more types of ligands attached to an outer surface of said PbS colloidal nanocrystals, the outer surface having at least two distinct crystal facets exposed at the outer surface of the PbS colloidal nanocrystal, one of the exposed crystal facets being a neutral and non-polar facet, at least another of the exposed crystal facets being a non-neutral and polar facet, dispersing the PbS colloidal nanocrystals having one or more types of ligands attached to an outer surface in an organic solvent;

b) synthesizing dual passivated PbS colloidal nanocrystals by dissolving solutions of metal halides and alkali metal salt complexed with a moiety selected to enhance removal of original ligands on the surface of the PbS colloidal nanocrystals in a solvent to produce a precursor solution, the solvent being selected to be immiscible with the organic solvent;

adding the PbS colloidal nanocrystals dispersed in the organic solvent to the precursor solution to form a phase separated mixture comprised of the PbS colloidal nanocrystals dispersed in the organic solvent and the precursor solution;

c) inducing transfer of the PbS colloidal nanocrystals from the organic phase to the precursor solution phase by mixing the mixture such that the ligands are stripped from the outer surface of the PbS colloidal nanocrystal and the alkali metal passivates the neutral and non-polar crystal facet, and halide passivates the non-neutral and polar crystal facet thereby producing dual-passivated PbS colloidal nanocrystals;

d) washing the dual-passivated PbS colloidal nanocrystals in the precursor solvent with an organic solvent in order to remove any residual original ligands thereby; and e) precipitating the dual-passivated PbS colloidal nanocrystals by adding an anti-solvent and drying the precipitated dual-passivated PbS colloidal nanocrystals.

The step b) of synthesizing dual passivated PbS colloidal nanocrystals may include dissolving solutions of lead iodide ($PbI_2$), lead bromide ($PbBr_2$) and sodium acetate ($Na^+ \cdot Ac^-$) in dimethylformamide to produce a precursor solution, and mixing the PbS colloidal nanocrystals dispersed in the organic solvent with the precursor solution to form a mixture such that a dimethylformamide phase forms along with an organic solvent phase.

A further understanding of the functional and advantageous aspects of the disclosure can be realized by reference to the following detailed description and drawings.

BRIEF DESCRIPTION OF THE DRAWINGS

Embodiments will now be described, by way of example only, with reference to the drawings, in which:

FIGS. 1A to 1G relate to lead halide-passivated nanocrystals without Na-passivation on the (100) facets as conventionally performed and with Na-passivation on the (100) facets in which:

FIG. 1A shows schematic illustrations of two methods of ligand exchange, the conventional (top scheme) without Na-passivation, and facet-specific solution ligand exchange with Na-passivation according to the present disclosure (bottom scheme) for narrow-bandgap nanocrystals;

FIG. 1B shows a relative low-magnification HAADF-STEM image of ligand-exchanged nanocrystals using the conventional method;

FIG. 1C shows a high-magnification HAADF-STEM image of ligand-exchanged nanocrystals using the conventional method;

FIG. 1D shows a relative low-magnification HAADF-STEM image of ligand exchanged nanocrystals using the facet-specific method according to the present disclosure;

FIG. 1E shows a high-magnification HAADF-STEM image of ligand exchanged nanocrystals using the facet-specific method according to the present disclosure;

FIG. 1F shows a plot of intensity (a.u.) versus binding energy for XPS results for Na 1s of each nanocrystal after ligand exchange in solution phase;

FIG. 1G shows a plot of intensity (a.u.) versus binding energy for XPS results for I 3d peaks of each nanocrystal after ligand exchange in solution phase;

FIG. 2A shows a high resolution HAADF-STEM image of an approximately 3.5 nm-sized PbS nanocrystal and the corresponding diffractogram (inset), demonstrating the presence of (111) and (100) facets on the surface of the nanocrystal;

FIG. 2B shows a high resolution HAADF-STEM image of a different approximately 3.5 nm-sized PbS nanocrystal and the corresponding diffractogram (inset), demonstrating the presence of (111) and (100) facets on the surface of the nanocrystal;

FIG. 2C shows a high resolution HAADF-STEM image of yet another approximately 3.5 nm-sized PbS nanocrystal and the corresponding diffractogram (inset), demonstrating the presence of (111) and (100) facets on the surface of the nanocrystals;

FIG. 2D shows a high resolution HAADF-STEM image of different approximately 3.5 nm-sized PbS nanocrystals and their corresponding diffractograms (insets), demonstrating the presence of (111) and (100) facets on the surface of the nanocrystals;

FIG. 3A shows a high resolution HAADF-STEM image of an ensemble of lead halide-only passivated nanocrystals;

FIG. 3B shows the corresponding diffractogram obtained at the location of the white rectangles in FIG. 3A;

FIG. 3C shows a zoom-in on the aggregated nanocrystals from FIG. 3A, where the aggregation occurs along the (100) facet;

FIG. 3D shows a high resolution HAADF-STEM image of a different ensemble of lead halide-only passivated nanocrystals;

FIG. 3E shows the corresponding diffractogram obtained at the location of the white rectangles in FIG. 3D;

FIG. 3F shows a zoom-in on the aggregated nanocrystals from FIG. 3D, where the aggregation occurs along the (100) facet;

FIG. 3G shows a high resolution HAADF-STEM image of a different ensemble of lead halide-only passivated nanocrystals;

FIG. 3H shows the corresponding diffractogram obtained at the location of the white rectangles in FIG. 3G;

FIG. 3I shows a zoom-in on the aggregated nanocrystals from FIG. 3G, where the aggregation occurs along the (111) facet;

FIGS. 5A to 5B show the effects of Na on PbS(100) facets, in which:

FIG. 5A shows differential charge densities of $Na^+$ and $NH_4^+$ on a PbS(100) surface with the coverage of ¼ monolayer (ML), the isosurface level of the differential charge densities is 0.001 electrons/bohr$^3$, and the indicated areas represent a gain or loss of electron;

FIG. 5B shows Na 1s binding energy shift of dual-passivated PbS nanocrystals with different bandgaps measured from XPS, comparing with the Na 1s binding energy of $Na^+ \cdot Ac^-$ as a reference;

FIGS. 8A and 8B show the elemental analysis was performed using ICP-AES to confirm the remaining sodium on the colloidal quantum dot (CQD) nanocrystals in which:

FIG. 8A shows a 1.08 eV bandgap nanocrystals after facet-specific ligand exchange as a function of DMF washing times, for preparing the $1^{st}$ washed 1.08 eV bandgap nanocrystals with DMF, as-prepared nanocrystals was redispersed into DMF, precipitated with toluene, and centrifuged, this process was repeated for $2^{nd}$ washed sample, and as a result, sodium remained on the nanocrystals even though they were washed by DMF solvent;

FIG. 8B shows different bandgap nanocrystals with 1.16, 1.08 and 0.97 eV after facet-specific ligand exchange; as the bandgap decrease, higher ratio of sodium to lead was obtained because of the increased (100)/(111) ratio;

FIGS. 10A to 10D show photophysical studies on halide-passivated nanocrystal solids with and without additional Na passivation in which:

FIG. 10A shows absorption and PL spectra of nanocrystal solids prepared using $NH_4^+ \cdot Ac^-$ and $Na^+ \cdot Ac^-$, FIG. 10B shows photothermal deflection spectroscopy measurements for each sample, wherein the calculated Urbach energy is 28.5 meV for the dual-passivated nanocrystal solid using Na and lead halide (open circle), and 46.7 meV for the lead halide-only passivated nanocrystal solid (closed circle);

FIG. 10C shows excitonic bleaching peak with Gaussian fitting measured from TA;

FIG. 10D shows lifetimes at the central bleach with fits measured from TA.

FIG. 11A to 11D relate to halide-passivated colloidal quantum dot (CQD) nanocrystal solar cell devices with and without Na-passivation on (100) facets in which:

FIG. 11A shows cross-sectional SEM image of an IR CQD solar cell device;

FIG. 11B shows current-voltage (J-V) characteristic of the lead halide-only and dual passivated nanocrystal solar cells under AM1.5 simulated solar illumination;

FIG. 11C shows current-voltage (J-V) characteristic of the lead halide-only and dual passivated nanocrystal solar cells after using a silicon solar cell representative filter (long-pass 1100 nm filter);

FIG. 11D shows the EQE spectra for each solar cell device measured from 400 nm to 1400 nm;

DETAILED DESCRIPTION

Figure 1A:
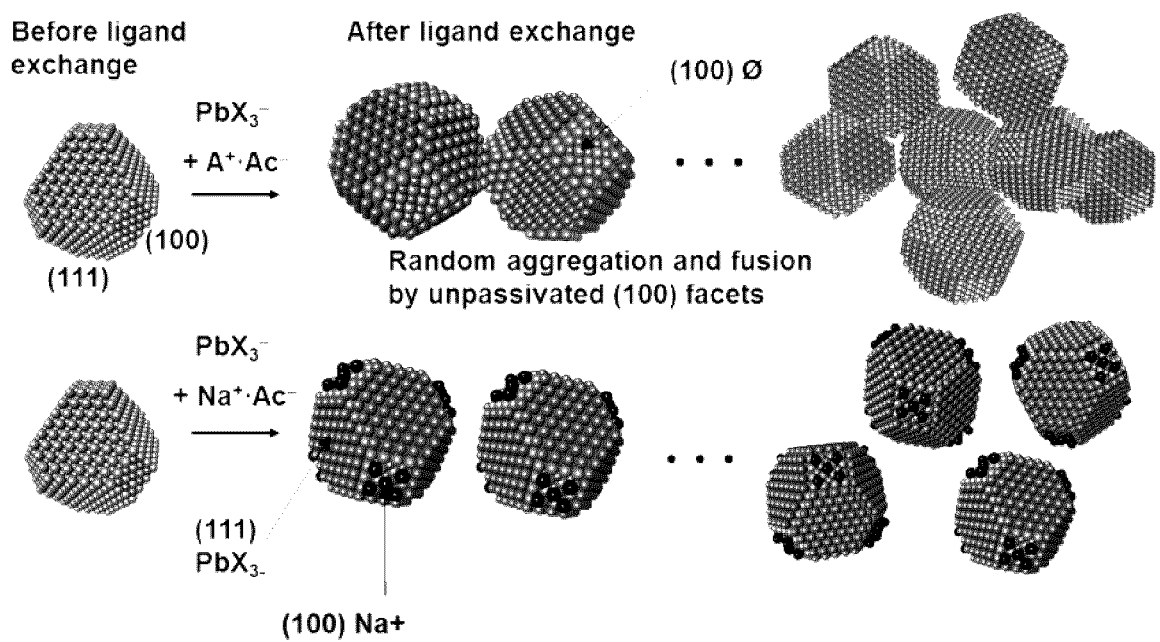

Various embodiments and aspects of the disclosure will be described with reference to details discussed below. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosure.

As used herein, the terms, "comprises" and "comprising" are to be construed as being inclusive and open ended, and not exclusive. Specifically, when used in the specification and claims, the terms, "comprises" and "comprising" and variations thereof mean the specified features, steps or components are included. These terms are not to be interpreted to exclude the presence of other features, steps or components.

As used herein, the term "exemplary" means "serving as an example, instance, or illustration," and should not be construed as preferred or advantageous over other configurations disclosed herein.

As used herein, the terms "about" and "approximately", when used in conjunction with ranges of dimensions of particles, compositions of mixtures or other physical properties or characteristics, are meant to cover slight variations that may exist in the upper and lower limits of the ranges of dimensions so as to not exclude embodiments where on average most of the dimensions are satisfied but where statistically dimensions may exist outside this region. It is not the intention to exclude embodiments such as these from the present disclosure.

As used herein the phrase polar facet means a non-stoichiometric crystal facet where the surface charge is non-zero.

As used herein the phrase non-polar facet means a stoichiometric crystal facet where the surface charge is zero.

Broadly, the present disclosure provides a colloidal quantum dot comprising at least two distinct classes of crystal facets exposed at an outer surface thereof, wherein a first class of crystal facets is substantially nonpolar, and wherein a second class of crystal facets is polar, wherein the substantially nonpolar facet is passivated by an alkali metal and the polar facet passivated by at least one halide.

The first class of crystal facets is substantially neutral in addition to being substantially nonpolar, and wherein said second class of crystal facets is substantially non-neutral in addition to being polar.

The colloidal quantum dot may have a size in a range from about 3 to about 10 nanometers.

The alkali metals is any one or combination of lithium, sodium, potassium, rubidium and cesium. In an embodiment alkali metal is sodium.

The halide is any one or combination of bromine, iodine and chlorine. In an embodiment the halide is a mixture of bromine and iodine. In another embodiment the halide is iodine.

In an embodiment the colloidal quantum dot may be, but is not limited to, any one or combination of lead sulfide (PbS), lead selenide (PbSe), lead telluride (PbTe)

In an embodiment the colloidal quantum dot is lead sulfide (PbS) in which the neutral and non-polar facet is the (100) crystal facet, and the non-neutral and polar facet is the (111) crystal facet or any other non-stoichiometric crystal facet. When the quantum dot is PbS the dots may have a size in a range from about 3 to about 10 nm.

The present disclosure also provides a method of facet-selective passivation on each crystal facet of colloidal nanocrystals by solution-phase ligand exchange, comprising:
a) providing nanocrystals having one or more types of ligands attached to an outer surface of said nanocrystals, the outer surface having at least two distinct crystal facets exposed at the outer surface of the colloidal quantum dot, one of said exposed crystal facets being a neutral and non-polar facet, at least another of said exposed crystal facets being a non-neutral and polar facet,
dispersing the nanocrystals having one or more types of ligands attached to an outer surface in an organic solvent;
b) synthesizing dual passivated nanocrystals by
dissolving solutions of metal halides and alkali metal salt complexed with a moiety selected to enhance removal of original ligands on the surface of the colloidal quantum dot in a solvent to produce a precursor solution, the solvent being selected to be immiscible with the organic solvent;
adding the nanocrystals dispersed in the organic solvent to the precursor solution to form a phase separated mixture comprised of the nanocrystals dispersed in the organic solvent and the precursor solution;
c) inducing transfer of the nanocrystals from the organic phase to the precursor solution phase by mixing the mixture such that the ligands are stripped from the outer surface of the colloidal quantum dot and the alkali metal passivates the neutral and non-polar crystal facet, and halide passivates the non-neutral and polar crystal facet thereby producing dual-passivated nanocrystals;
d) washing the dual-passivated nanocrystals in the precursor solvent with an organic solvent in order to remove any residual original ligands thereby; and
e) precipitating the dual-passivated nanocrystals by adding an anti-solvent and drying the precipitated dual-passivated nanocrystals;

The method further comprises a step of re-dispersing the dual-passivated nanocrystals in a solvent after step e).

The alkali metal is any one or combination of lithium, sodium, potassium, rubidium and cesium. In an embodiment alkali metal is sodium.

The halide is any one or combination of bromine, iodine and chlorine. In an embodiment the halide is a mixture of bromine and iodine. In another embodiment the halide is iodine.

In an embodiment the colloidal quantum dot is lead sulfide (PbS). The neutral and non-polar facet is the (100) crystal facet and wherein the non-neutral and polar facet is the (111) crystal facet or any other nonstoichiometric crystal facet.

It is recognized that for those skilled in the art, a nanocrystal is a particle with a size that can range typically between about 1 nm and more than about 100 nm.

The present disclosure will now be illustrated using the following non-limiting example of lead sulfide (PbS) nanocrystals, but it will be understood that this disclosure is not restricted to PbS.

Example

The inventors disclose herein a strategy to preserve colloidal stability and quantum confinement in narrow-bandgap nanocrystals (e.g. PbS) during the solution-phase ligand exchange. The inventors pursued nonpolar (100) facet passivation by first replacing the ammonium cation ($NH_4^+$) used in conventional ligand exchange with alkaline metal cations: this enabled improved solubilization of narrow-bandgap nanocrystals in polar solvents during the ligand exchange[28,29]. In light of the ionic sizes of the alkaline cations, taken together with the dissociation constant of alkaline metal acetate, we focused on sodium acetate ($Na^+·Ac^-$), which has the appropriate ionic size as well as a high dissociation constant[40]. The inventors hypothesized that a strategy that utilizes $Na^+·Ac^-$ can provide facet-specific passivation via sodium (Na) and lead halides on the (100) and (111) facets of nanocrystals, respectively. Na-passivation on the (100) facet allows narrow-bandgap nanocrystals with improved colloidal stability in polar solvents, leading to improved photophysical properties.

The strategy disclosed herein significantly enhances solar cell performance, leading to 33% and 48% increases in power conversion efficiency under full and 1100 nm-filtered solar spectra respectively, compared to the lead halide-only passivated nanocrystals following the conventional ligand exchange method for PbS nanocrystals. The best-performing device shows a record-high external quantum yield (EQE) that reaches ~70% at the excitonic peak.

Materials and Methods

Materials
Preparation of PbS nanocrystals

Oleic-acid PbS nanocrystals were synthesized using a previously published method[28]. Dual-passivated PbS nanocrystals were prepared through a solution ligand exchange process of OA-nanocrystals in a test tube under atmospheric conditions as follows. First, for precursor solutions, 0.23 mg (0.50 mmol) of lead iodide ($PbI_2$), 0.037 mg (0.11 mmol) of lead bromide ($PbBr_2$) and 0.017 mg (0.21 mmol) of sodium acetate ($Na^+·Ac^-$) were completely dissolved in 5 mL of dimethylformamide (DMF). 5 mL of OA-nanocrystals dispersed in octane (6 mg $mL^{-1}$) were added to the precursor solution, and transferred to DMF phase by vortexing vigorously for 5 min. The PbS nanocrystals in DMF phase were then washed three times using octane in order to remove residual original ligands (i.e., OA). After being washed completely, the dual-passivated PbS nanocrystals were precipitated by adding toluene (2.5 mL) as an anti-solvent, and dried under vacuum for 20 min, and finally dispersed in a mix of 90% butylamine (BTA) and 10% DMF at the desired concentrations. For the lead halide-only passivated PbS nanocrystals, we replaced $Na^+·Ac^-$ in the same recipe above mentioned with ammonium acetate. In this case, two phase nanocrystal solution after ligand exchange is not clearly phase-separated, therefore it is forced by centrifugation to separate two phase for removing the remaining OA from DMF phase.

Fabrication of Nanocrystal Solar Cell Devices

ITO glass substrates were cleaned by soaking and sonicating sequentially in acetone, isopropyl alcohol, and deionized water. ZnO nanoparticles were synthesized as previously reported[16,28]. The ZnO nanoparticle solution was spin-coated onto the cleaned ITO glass two times at 3000 rpm for 30 sec to form the substrate, and subsequently dual and lead halide-only passivated nanocrystals in a mixture of 90% BTA and 10% DMF (200 mg/mL) were spin-coated at 2600 rpm for 30 sec. For the final device fabrication, two thin layers of 1,2-ethanedithiol (EDT)-treated nanocrystals (EDT-nanocrystals) were deposited, followed by gold deposition as a top metal electrode.

Measurement of High Angle Annular Dark Field Scanning Transmission Electron Microscopy (HAADF-STEM)

High resolution HAADF-STEM images were acquired using a cubed FEI Titan microscope operating at 300 kV. A probe semiconvergence angle of ~20 mrad was used.

Measurement of X-Ray Photoelectron Spectroscopy (XPS)

XPS measurements were performed using a Thermo Scientific K-Alpha system, with a 50 eV pass energy, and binding energy steps of 0.05 eV. All binding energy values were corrected relative to the reference C 1s peak (284.5 eV). All signals were normalized to Pb.

Measurement of Optical Absorption, Photoluminescence (PL) and Photoluminescence Quantum Yield (PLQY)

The total light absorption (A) was determined by A=1−R−T, where R is the total reflectance measured from the glass side and T is the total transmittance through the back of solar cells (T=0 for devices with gold electrode). R and T were measured using a Perkin Elmer LAMBDA 950 spectrometer equipped with an integrating sphere. PL spectra and PLQY measurements were carried out using a Horiba FluoroLog-3 spectrofluorometer in reflection geometry under ambient conditions. An integrating sphere was used for obtaining solution-phase PLQY values. The sample was excited using a 633 nm pulsed laser diode (<1 ns). The emission was passed through a 1000 nm blaze grating monochromator (iHR320) and collected by an infrared photomultiplier tube.

Measurement of Transient Absorption (TA)

A regeneratively amplified Yb:KGW laser at a 5 kHz repetition rate (Light Conversion, Pharos) was used to generate ultrafast pulses at 1030 nm. The output of the laser passes through a beamsplitter, where one arm is sent to an optical parametric amplifier (Light Conversion, Orpheus) to generate photoexcitation (pump) pulses with a ~350-fs-duration, and the other arm is sent to a sapphire crystal to generate the NIR continuum spectrum. The pump and probe pulses are then both sent into a commercial transient absorption spectrometer (Ultrafast, Helios). The probe pulse was delayed relative to the pump pulse using a delay stage permitting delays up to 8 ns, and a chopper was used to block every other pump pulse. The signal after the sample is dispersed by a grating spectrograph (Ultrafast, Helios) and subsequently collected by a CCD camera. Lifetimes were fit using biexponential decays convoluted with a Gaussian to account for the Instrument Response Function (IRF). Transient absorption spectral slices were fit as a sum of one or more Gaussian peaks with negative coefficients for bleaching signals and positive coefficients for photo induced absorption signals.

Measurement of Inductively Coupled Plasma Atomic Emission Spectrometry (ICP-AES)

Total contents of sodium and lead elements in the dual passivated nanocrystals were characterized using the Optima 7300 DV ICP-AES (Perkin-Elmer, USA). The resulting nanocrystals were dissolved in 0.1 M nitric acid in deionized water for preparing ICP-AES samples.

Characterization of Solar Cell Device

The current density-voltage curves of each device were tested under $N_2$ flow using a Keithley 2400 SourceMeter. The solar spectrum at AM1.5G was simulated to within class A specifications (<25% spectral mismatch) with a xenon (Xe) lamp and filters (Solar Light Company Inc.) with measured intensity of 100 mW/cm². The illumination power was calibrated using a Melles-Griot broadband power meter and a Thorlabs broadband power meter through a circular optical aperture (area 0.049 cm²) at the position of the device and confirmed with a calibrated reference Si solar cell (Newport, Inc.). The final accuracy of the solar-to-electricity measurement was estimated to be ±5%. 1100 nm long-pass filter from Thorlabs, Inc. was used to represent a silicon solar cell.

Calculation of Spectral Mismatch

The spectral power within the wavelength region of interest was calibrated using the lamp spectrum supplied by the manufacturer. The absolute power of the lamp spectrum was measured with a calibrated power meter and a set of calibrated long-pass filters. The external quantum efficiency (EQE) spectrum of the nanocrystal solar cell device was measured and used to calculate the mismatch factor between the lamp spectrum filtered with a 1100 nm long-pass filter (1100 LPF) and the AM1.5 spectrum beyond 1100 nm. The spectral mismatch was calculated with the ratio of the integral of the product of the lamp spectrum, the EQE spectrum, and 1100 LPF spectrum and the integral of the product of the AM1.5 spectrum, the EQE spectrum, and 1100 LPF spectrum. This resulted in a mismatch factor of 1.5. The main error in the mismatch factor is estimated to be in the calibration of the lamp spectrum, estimated to be about 10%.

Measurement of External Quantum Efficiency (EQE)

External quantum efficiency (EQE) spectra were carried out by aligning the cell to monochromatic light (a 400 W Xe lamp passing through a monochromator and proper cur-off filters). The active area was defined by optical aperture, and the light power was calibrated with Newport 818-UV and Newport 838-IR photodetectors. The monochromatic light beam was chopped at 220 Hz and was collimated onto the device active layer using a solar simulator at 1 sun intensity to provide light bias. Pre-amplifier (Stanford Research Systems SR570) and lock-in amplifier (Stanford Research 830) were used for collecting the current signals from the solar cell devices.

Other Measurements

Cross-sectional images were obtained from the field-emission scanning electron microscope (FE-SEM, Hitachi SU8230). High-resolution transmission electron microscopy (HR-TEM) was performed using Hitachi HF3300.

Results

Schematic illustrations (FIG. 1A) depict conventional and facet-specific solution ligand exchange for narrow-bandgap nanocrystals. nanocrystals with size-tunable bandgaps have a high-symmetry rock-salt structure and, when synthesized as nanocrystals using an oleic acid ligand, exhibit well-defined (111) and (100) facets[22,23], see FIGS. 2A to 2D which show high resolution HAADF-STEM images and their corresponding diffractograms showing the presence of (111) and (100) facets of approximately 3.5 nm-sized PbS nanocrystals used in this study. Approximately 30 PbS nanocrystals were investigated revealing similar results.

The surface of ultrasmall nanocrystals is dominated by the (111) facet, producing an octahedral nanoparticle shape. The (100) facet is expected gradually to appear with increasing nanocrystal size, altering the (111) facet-only octahedron to the (111)/(100) cuboctahedron shape[22]. As-synthesized nanocrystals, stabilized by oleic acid ligands on the (100) and (111) facets through different binding mechanisms, are highly dispersible in nonpolar solvents such as octane[23].

Figure 1B:
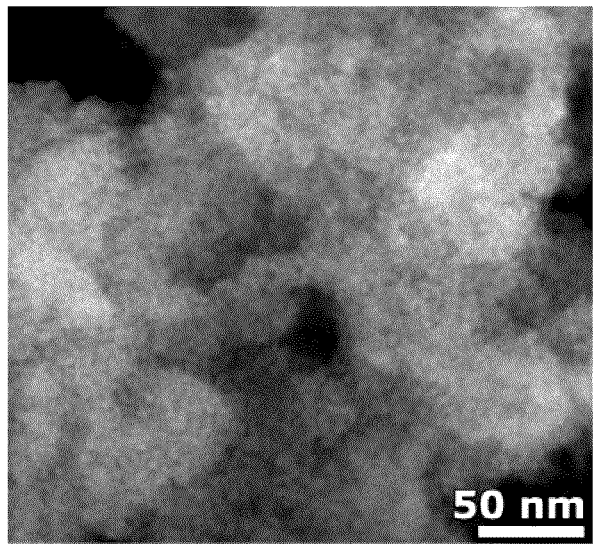
Figure 1C:
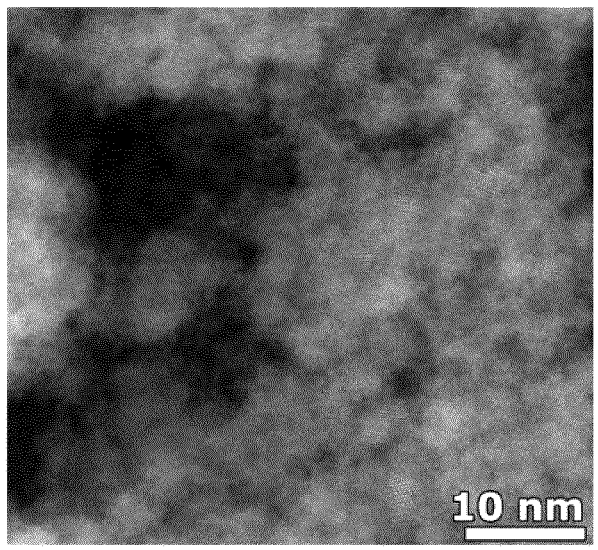

In previously-reported processing methods, the ligand exchange of oleic acid to lead halides (i.e., $[PbX_3]^-$) occurs mainly on the Pb-rich and polar (111) facets of nanocrystals, leading to a higher affinity of anionic ligand species with the aid of acidic $NH_4^+$ cations[25,25]. However, this method is not suited to narrow-bandgap nanocrystals that exhibit larger (100) facets. These nanocrystals cannot be colloidally stabilized, and thus aggregate and even fuse during ligand exchange since oleic acid ligands on the (100) facet are easily removed in polar solvents such as dimethylformamide (DMF) (FIGS. 1A, 1B, and 1C)[24,27]. As a result, ligand-exchanged nanocrystals show a clumped structure accompanied by the loss of colloidal stability and severe degradation in photophysical properties, see FIG. 1B and FIGS. 3A to 3I).

Density functional theory (DFT) calculations were performed with the Vienna Ab Initio Simulation Package (VASP) code[2,3]. Perdew-Burke-Ernzerhof (PBE)[4] functionals were used to treat the exchange-correlation functional and the projector-augmented wave (PAW) methods was used to solve the ion-electron interactions in the periodic boundary conditions. A Monkhorst-Pack mesh[6] with a grid of (4×4×1) k-points was chosen for the surface calculations. The electronic wavefunctions at each k-point were expanded with a plan-wave energy cutoff up to 400 eV.

In this study, we chose the PbS(111) and (100) surfaces to investigate since they are the only exposed surfaces in a ~3-4 nm PbS QD. The PbS(111) and (100) surfaces were constructed using a (3×3) and a (4×4) periodicity with a four-layer slab separated by a vacuum layer of 31 Å. This can allow us to study the adsorbate coverage as low as ⅑ Monolayer (ML) on (111) facet and 1/16 ML on (100) facet, respectively. For the slabs, we fixed the bottom two layers at their bulk equilibrium positions and only relaxed the top two layers to examine the electronic interactions between the surface and adsorbates. The conjugate-gradient algorithm was adopted to relax the ions into their ground state with the length of the trial step controlled by a force scaling constant of 0.1. All self-consistent field (SCF) calculations were converged to $10^{-4}$ eV and the forces were smaller than 0.03 eV/Å. The PbS lattice constant was calculated and found to be 5.995 Å (6.006 Å)[7] and is within 1.0% of the experimental value of 5.932 Å[8].

Figure 5A:
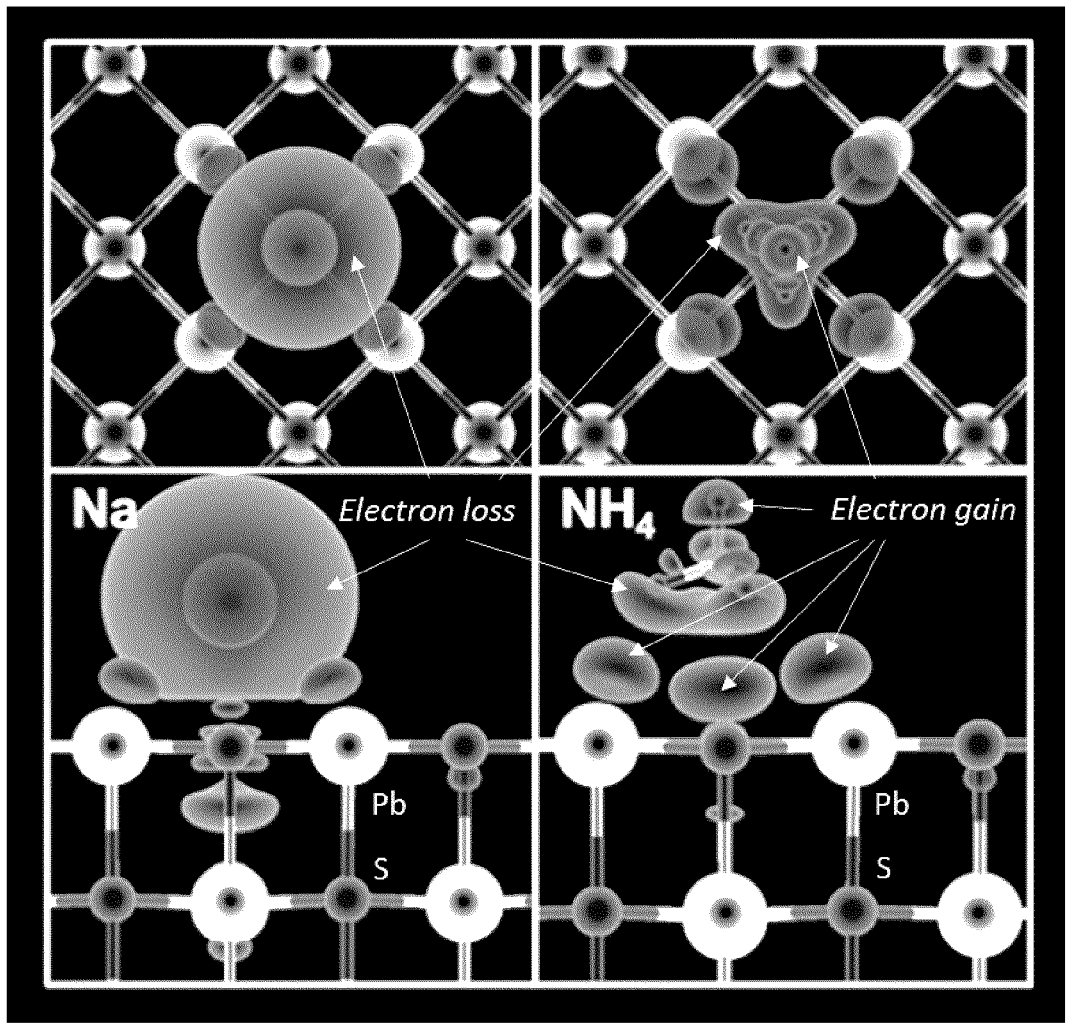

To examine the adsorption of sodium metal and ammonium cations on a PbS(100) surface, we first calculated the different adsorption sites (i.e., Pb-top, S-top, PbS-bridge). The optimized structure shows that the adsorption can only be stable when sodium adsorbs on the top of S atom on a PbS(100) surface. Additionally, according to the corresponding experiments, the PbS(111) surface is covered by the iodine species. Thus, for the PbS(111) surface, the sodium adsorbs at the hollow site on a PbS(111) surface with a full coverage of iodine species. The bonding strength of sodium and ammonia can be reflected by presenting the differential charge densities as shown in FIG. 5A.

In addition, in the main manuscript, we performed the core level binding energy shift (CLBEs) calculations for Na adsorption on a PbS(100) and PbS(111) surface as compared to sodium acetate. The core level binding energy can present how tightly the core electrons of an atom are bound. The results can compare with the X-ray photoelectron spectroscopy (XPS) experimental measurement to confirm the binding environment for the adsorbate on a surface. DFT calculations with VASP code can examine the core level binding energy ($E_{CLBE}$) by:

$$E_{CLBE} = E_{n_c-1} - E_{n_c} \qquad (1)$$

where $E_{n_c-1}$ and $E_{n_c}$ stand for the total energy of the system where one core electron is removed and placed into the valence and the total energy of its corresponding ground state, respectively. However, the absolute DFT energies are not meaningful since VASP usually reports valence energies only. Thus, only the relative shifts of the core electron binding energies can be comparable with the experimental observations. The relative core level energy shifts are defined as:

$$E_{CLBEs} = (E(\text{system1})_{n_c-1} - E(\text{system1})_{n_c}) - (E(\text{system2})_{n_c-1} - E(\text{system2})_{n_c}) \qquad (2)$$

In the present study work, the inventors have calculated the core level binding energy shifts for the Na 1s orbital when Na adsorb on a PbS(100) and PbS(111) surface. The reference in theoretical calculations is the Na 1s orbital in sodium acetate ($Na^+ \cdot Ac^-$), which is the same as experimental XPS measurement. The optimized configurations for the different coverages of the Na species on a PbS(111) surface covered with the iodine species are presented in FIG. 6. The optimized configurations for the Na species on a PbS(100) surface with various coverages are presented in FIG. 7.

Figure 1D:
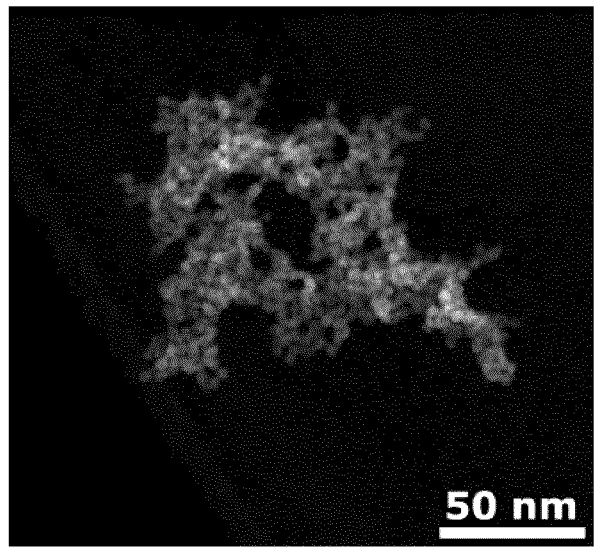
Figure 1E:
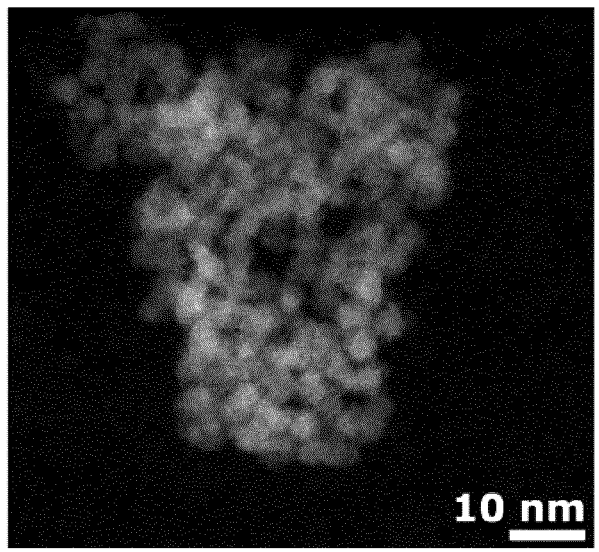
Figure 1F:
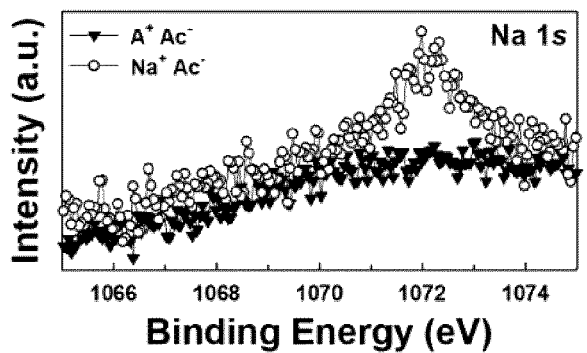
Figure 1G:
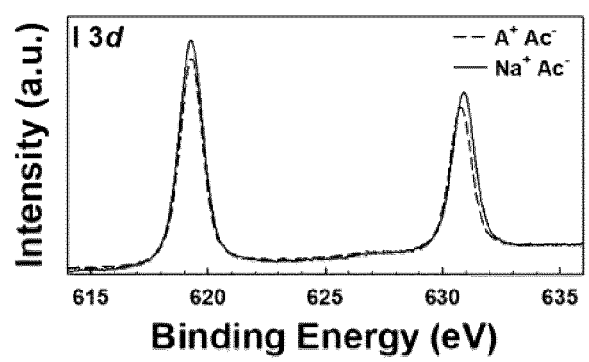
Figure 2A:
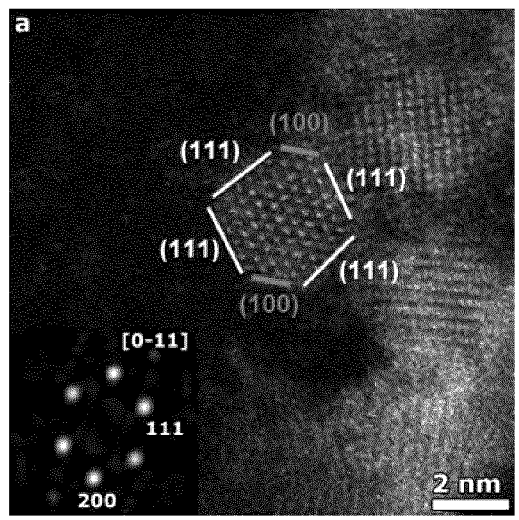
FIGS. 2A to 2D relate to the crystal facets that are present on approximately 3.5 nm-sized nanocrystals used in this study in which FIGS. 2A to 2D give representative examples of approximately 30 PbS nanocrystals that were imaged and analyzed.
Figure 2B:
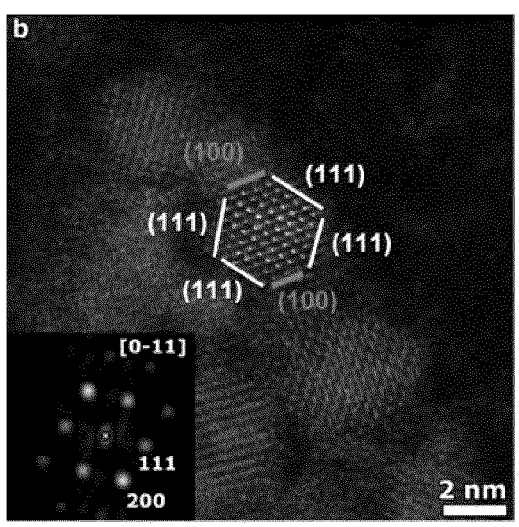
Figure 2C:
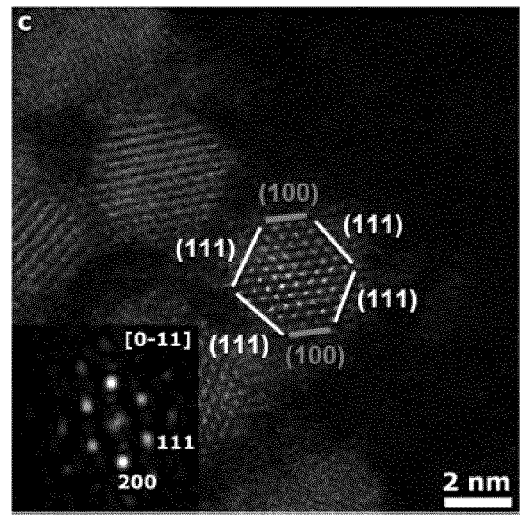
Figure 2D:
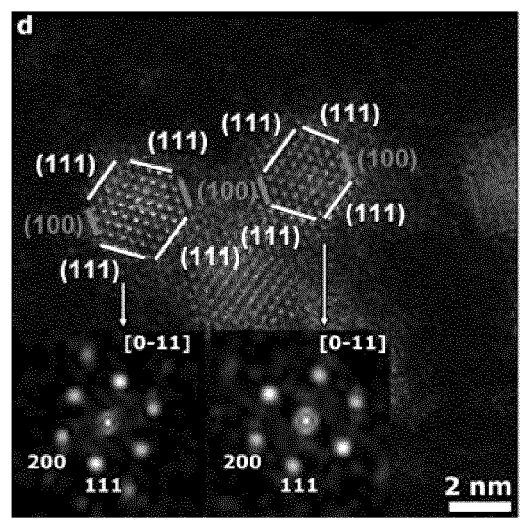
Figure 3A:
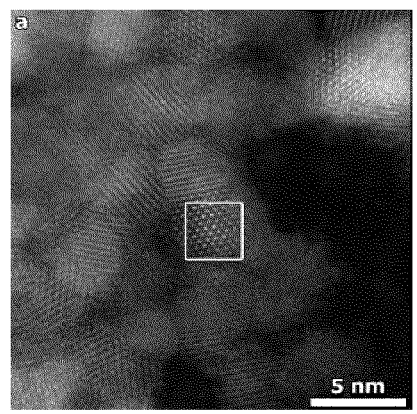
FIGS. 3A to 3I relate to the aggregation of lead halide-only passivated nanocrystals long different facets in which the figures show representative examples of the nanocrystal aggregation occurring on the (100) or (111) surfaces.
Figure 3B:
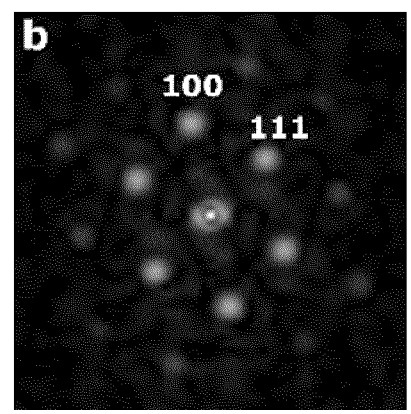
Figure 3C:
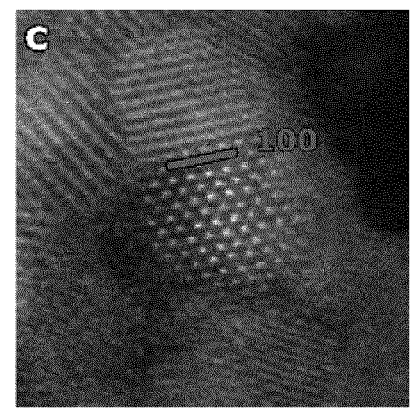
Figure 3D:
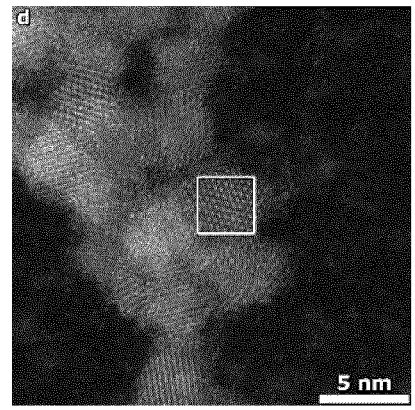
Figure 3E:
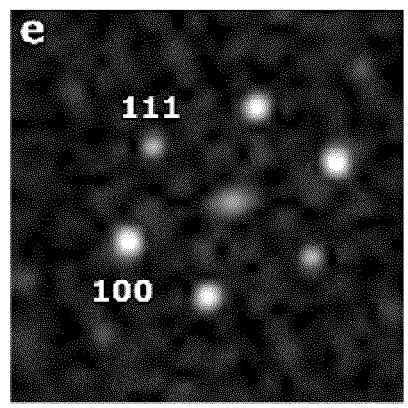
Figure 3F:
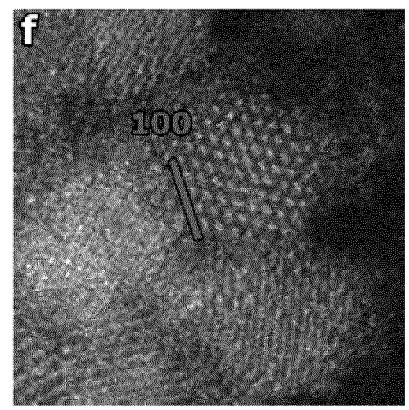
Figure 3G:
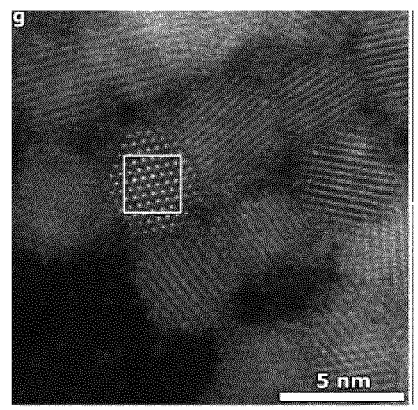
Figure 3H:
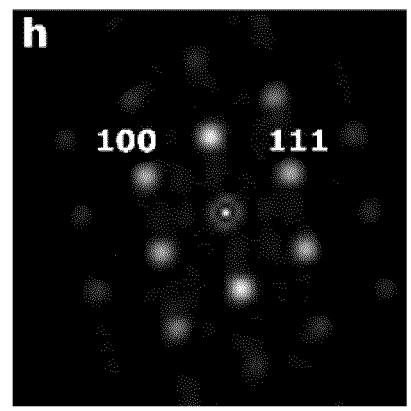
Figure 3I:
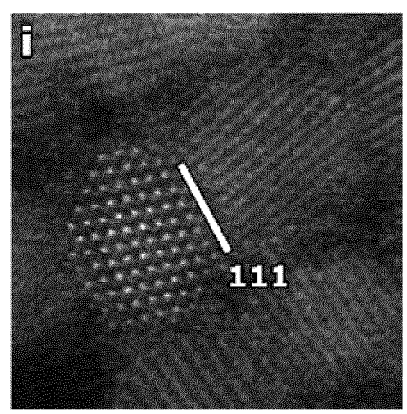
Figure 4A:
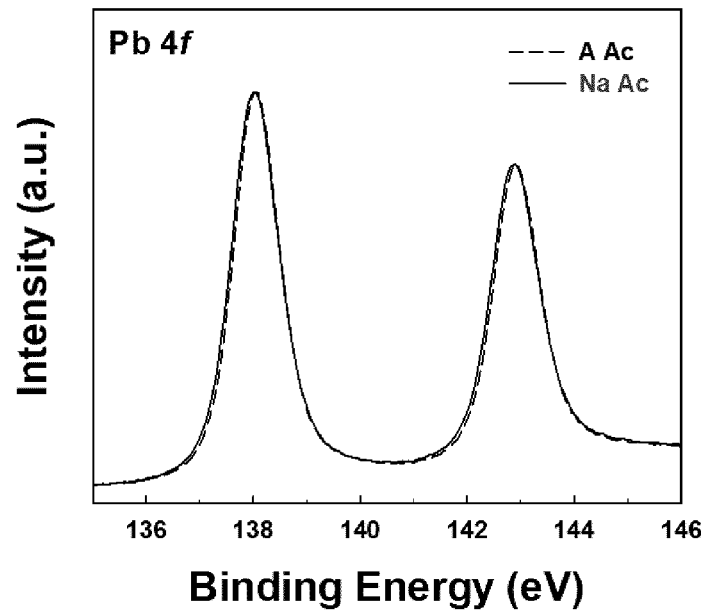
FIG. 4A shows XPS results (Pb 4f) of lead halide-only and dual passivated nanocrystal solids after ligand exchange.
Figure 4B:
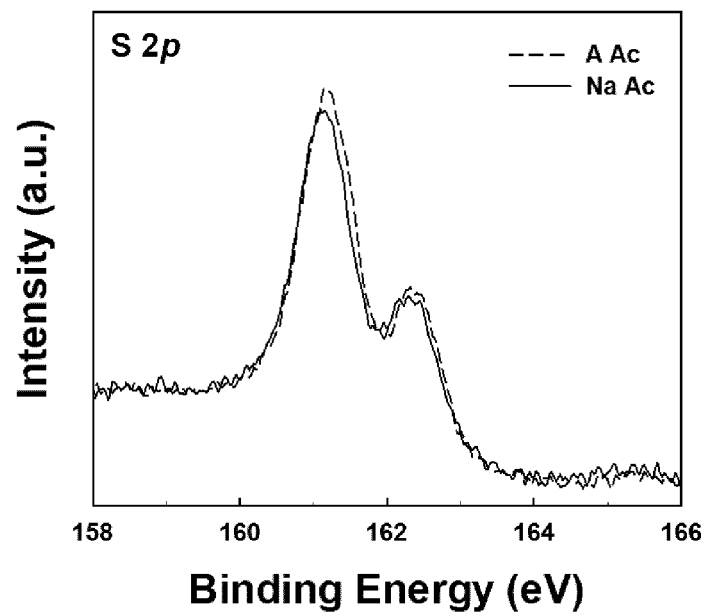
FIG. 4B shows XPS results (S 3p) of lead halide-only and dual passivated nanocrystal solids after ligand exchange.

The inventors targeted passivation of (100) facets to avoid aggregate assembly via unpassivated (100) facets in polar solvents that lead to nanocrystal flocculation. By replacing the $NH_4^+ \cdot Ac^-$ with the $Na^+ \cdot Ac^-$ in a lead halide-based ligand exchange process, we induce the facet-specific passivation of nanocrystals with the Na-passivated (100) facet and lead halide-passivated (111) facet. $Na^+ \cdot Ac^-$ provides high colloidal stability during and after the solution ligand exchange, resulting in improved surface passivation of lead halides due to the significantly reduced degree of aggregation (FIGS. 1D and 1E). This is also confirmed via X-ray photoelectron spectroscopy (XPS) that nanocrystal solids prepared from facet-specific passivation exhibit more iodine signal as well as Na, indicating improves lead-halide passivation compared to that provided using conventional ligand exchange (FIGS. 1F and 1G, and FIGS. 4A and 4B).

To challenge this hypothesis, we first examined the adsorption strength of $Na^+$ and $NH_4^+$ on a PbS(100) surface using density functional theory (DFT) calculations[30,31]. The differential charge density shows that electron exchange between $Na^+$ and PbS(100) is favorable compared to that between $NH_4^+$ and PbS(100), suggesting that the adsorption strength of $Na^+$ on PbS(100) is stronger than that of $NH_4^+$ (FIG. 5A). In addition, we find that $Na^+$ sits on the PbS(100) surface rather than on the PbS(111) surface, a fact revealed via Na 1 s core level binding energy shift (CLBEs) calculations[32] along with experimental XPS studies. Na prefers to bind to sulfur than lead on a (100) facet, while for PbS(111), Na-adsorption occurs specifically on a (111) facet passivated using iodine species.

Figure 5B:
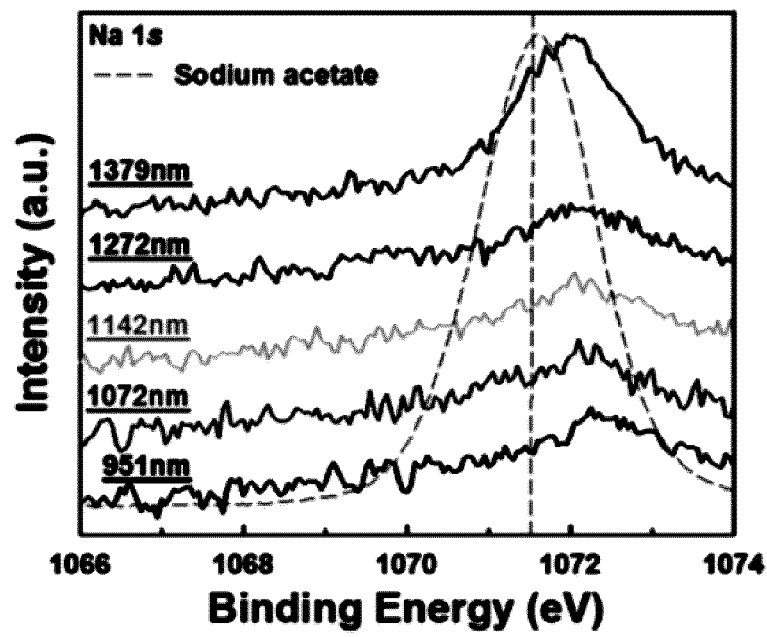
Figure 5C:
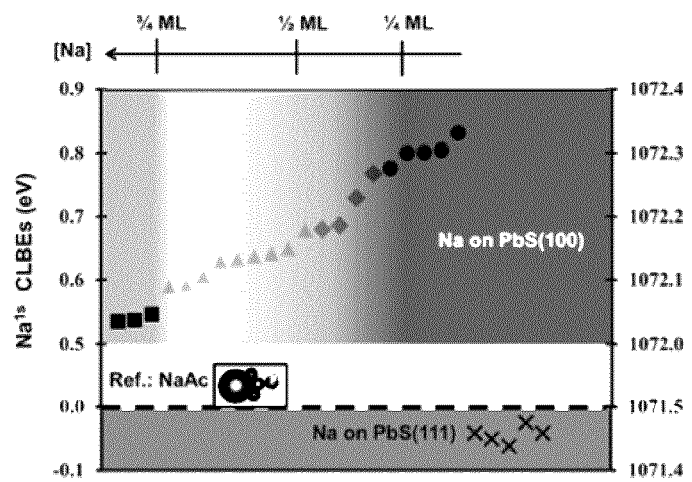
FIG. 5C shows the theoretical Na 1s core level binding energy shift (CLBEs) for Na adsorbed on PbS(100) and PbS(111) with various Na coverage, all the Na 1s CLBEs referred to the one in $Na^+ \cdot Ac^-$.
Figure 5D:
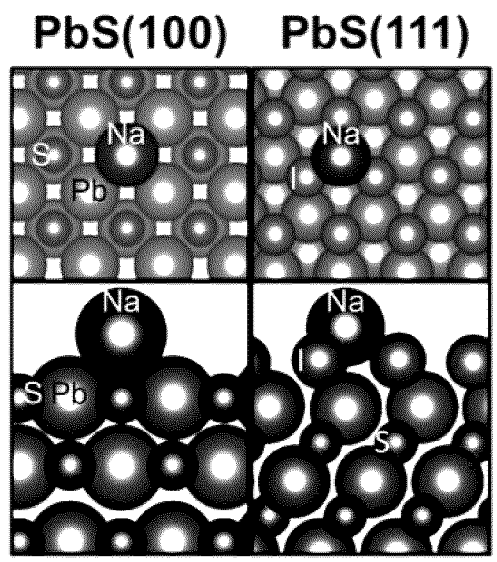
FIG. 5D shows the configuration of the Pb, S, Na, and I atoms on PbS(100) and PbS(111) surfaces.
Figure 6:
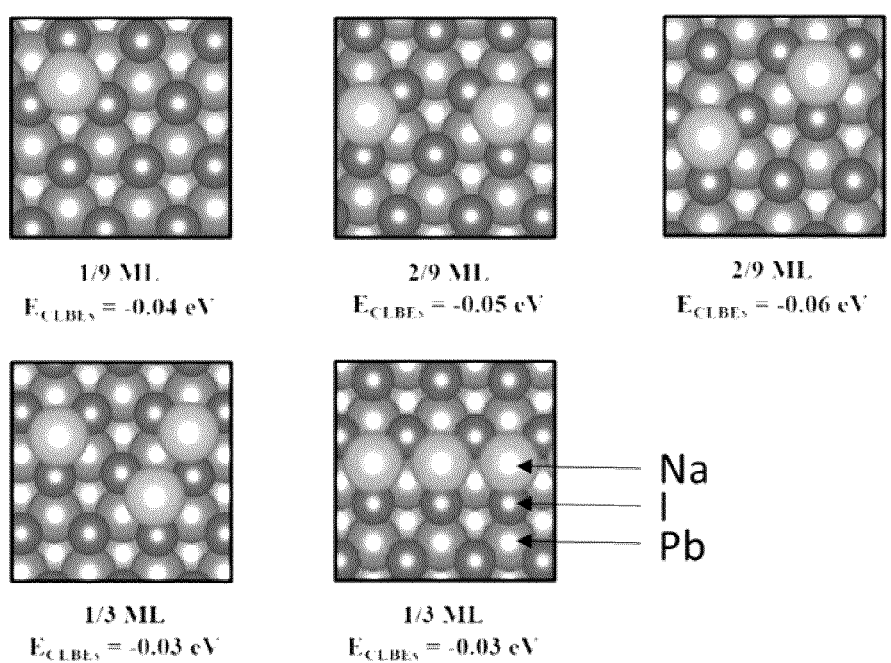
FIG. 6 shows the optimized configurations for the Na species on a PbS(111) surface covered with iodine species. The examined coverages for Na are in the range of ⅑ ML to ⅓ ML.
Figure 7:
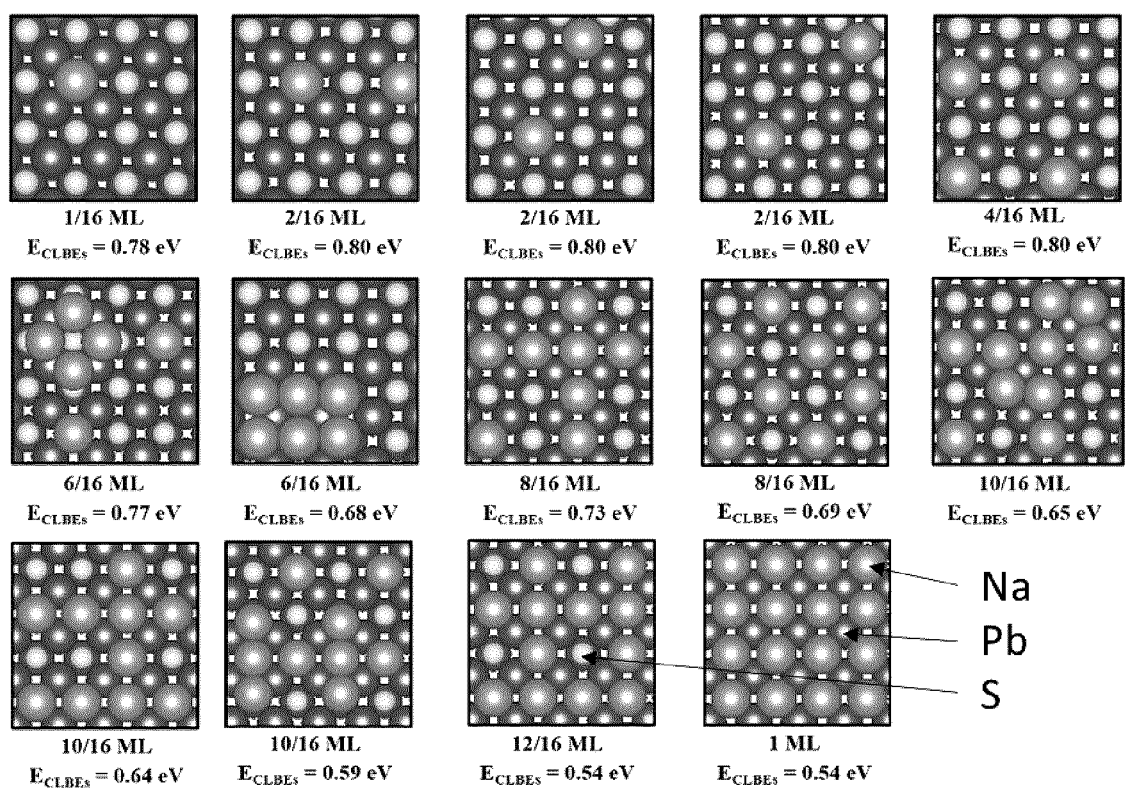
FIG. 7 shows the optimized configurations for the Na species on a PbS(100) surface with various coverages in the range of 1/16 Monolayer (ML) to 1 ML. The CLBE of Na 1s on the (100) surfaces shifts over the range of 0.5 eV to 0.8 eV.

The CLBE of Na 1s adsorbed on the iodine-covered (111) surface shifts only over the range of −0.1 eV to 0.0 eV (with Na coverage: ⅑ ML or ⅓ ML) relative to $Na^+ \cdot Ac^-$ salt reference (FIGS. 5C, 5D, and FIG. 6). In contrast, the CLBE of Na 1s on (100) surface shifts over the range of 0.5 eV to 0.8 eV (with Na coverage: 1/16 ML or 1 ML) (FIG. 7). This is consistent with the Na 1s binding energy shift of Na-passivated nanocrystals obtained from the XPS measurements, comparing with Na 1s binding energy of $Na^+ \cdot Ac^-$ as a reference (FIG. 5B). These results indicate that Na is concentrated primarily on the (100) facet. In addition, elemental analysis using inductively coupled plasma atomic emission spectrometry (ICP-AES) reveals that Na remains on the nanocrystals after ligand exchange, see FIG. 8.

FIGS. 8A and 8B are two tables showing the results of elemental analysis performed using ICP-AES to confirm the remaining sodium on the nanocrystals. In particular FIG. 8A shows 1.08 eV bandgap nanocrystals after facet-specific ligand exchange as a function of DMF washing times. For preparing the 1st washed 1.08 eV bandgap nanocrystals with DMF, as-prepared nanocrystals was redispersed into DMF, precipitated with toluene, and centrifuged. This process was repeated for 2nd washed sample. As a result, sodium remained on the nanocrystals even though they were washed by DMF solvent. FIG. 8B shows different bandgap nanocrystals with 1.16, 1.08 and 0.97 eV after facet-specific ligand exchange. As the bandgap decreases, a higher ratio of sodium to lead was obtained because of the increased (100)/(111) ratio.

Figure 9:
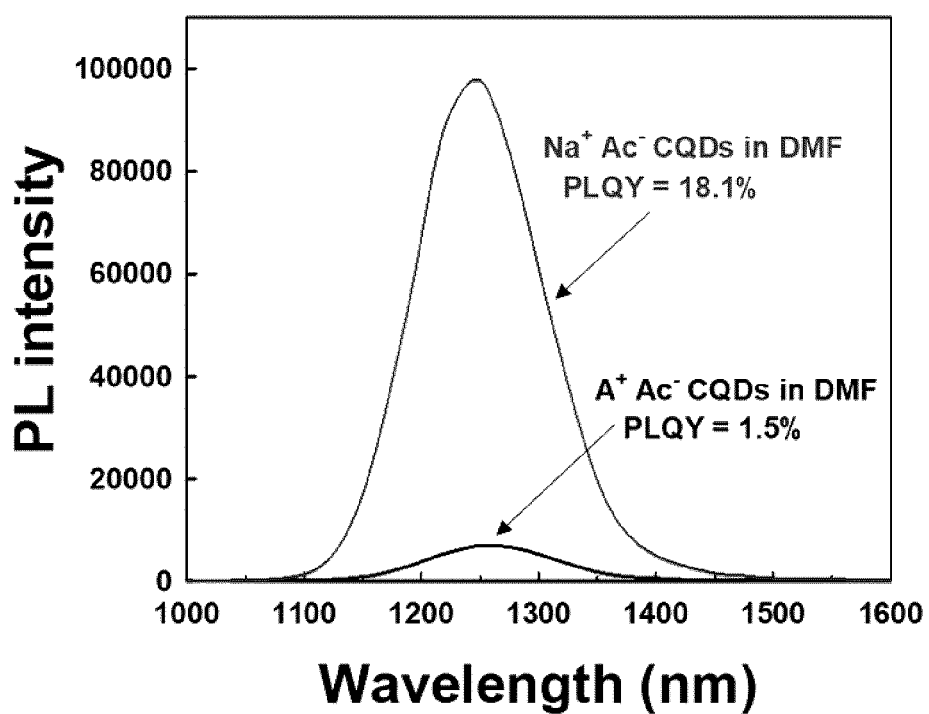
FIG. 9 shows solution-phase photoluminescence (PL) spectra and photoluminescence quantum yield (PLQY) of each narrow-bandgap colloidal quantum dot (CQD) nanocrystal in DMF solvent.
Figure 10A:
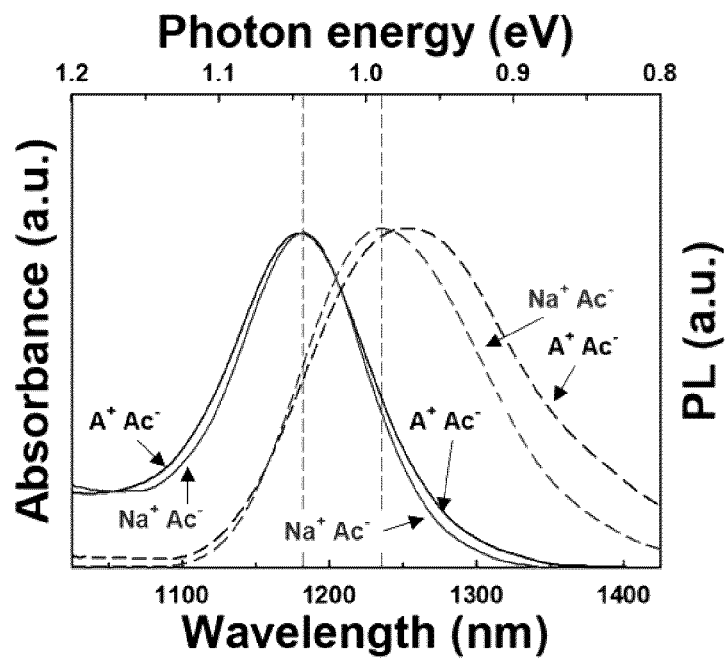

This new facet-specific passivation enabled narrow-bandgap nanocrystals to achieve a high solution-phase photoluminescence quantum yield (PLQY) in DMF (18%), preserving the surface passivation of the original oleic acid-capped nanocrystals in octane (20%) (FIG. 9). Absorption and PL spectra reveal the effect of facet-specific passivation on the nanocrystal solids. Dually-passivated nanocrystal solids show a narrower exciton peak with a full-width at half-maximum (FWHM) of 84 meV, compared to that of lead halide-only passivated nanocrystals (94 meV) having the same peak position of 1180 nm. The PL spectrum shows that the FWHM of dually-passivated nanocrystals (112 meV) is narrower than that of lead halide-only passivated nanocrystals (133 meV). The blue-shift of PL peak position reveals a smaller Stokes shift of 47 meV for dually-passivated nanocrystals, compared to that of 62 meV for lead halide-only passivated nanocrystals (FIG. 10A)[32,33].

Figure 10B:
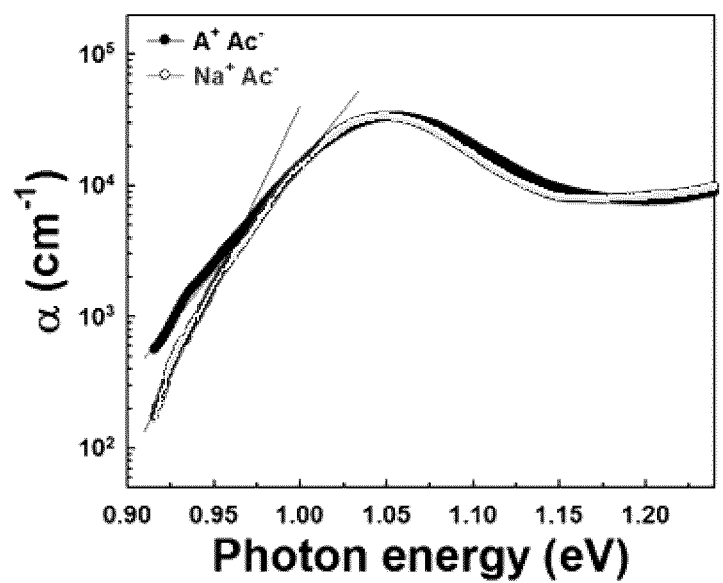

The inventors studied optical absorption using photothermal deflection spectroscopy in order to study the effect of energetic disorder in the nanocrystal solid. This technique allows investigation of the tail states below the bandgap, allowing estimation of the Urbach energy[35,36]. Dually-passivated nanocrystal solids using Na and lead halide showed an Urbach energy of 29±1 meV, fully 40% lower than that of lead halide-only passivated nanocrystal solids with their bandtail of 47±2 meV (FIG. 10B).

Figure 10C:
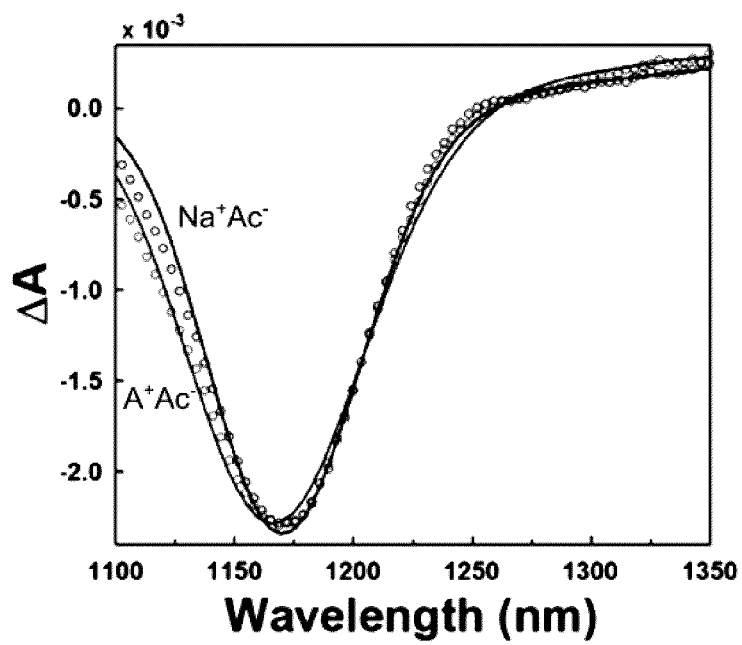
Figure 10D:
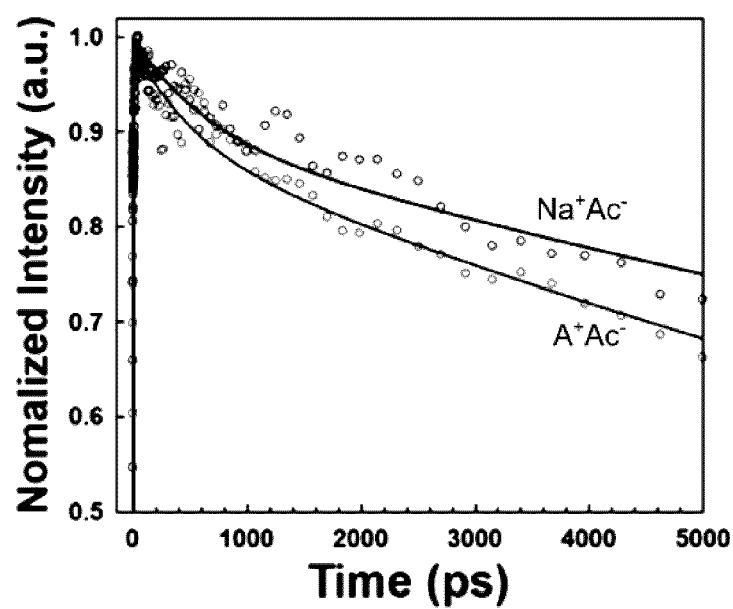

In ultrafast transient absorption (TA) spectroscopy, we observed that dually-passivated nanocrystals exhibited a narrower bleach peak compared to lead halide-only passivated nanocrystals (FIG. 10C). By fitting the TA spectra to two Gaussians, we found the FWHM of the excitonic bleaching signal for the dually-passivated vs. lead halide-only passivated nanocrystals are 29±1 and 34±3 meV, respectively. In addition, the dually-passivated nanocrystals have longer lifetimes of ~27±2 ns compared to ~19±1 ns for lead halide-only passivated nanocrystals (FIG. 10D). The facet-specific passivation strategy enables enhanced photophysical properties of narrow-bandgap nanocrystals in both solution- and solid-phase.

Figure 11A:
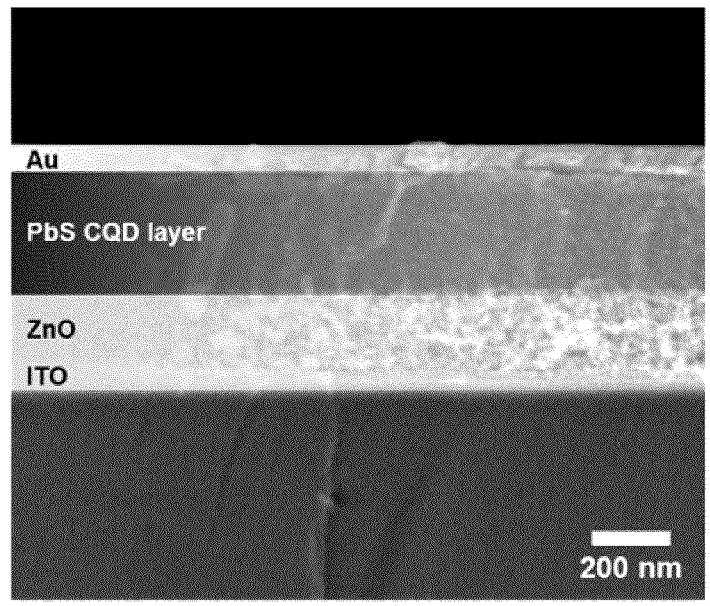
Figure 11B:
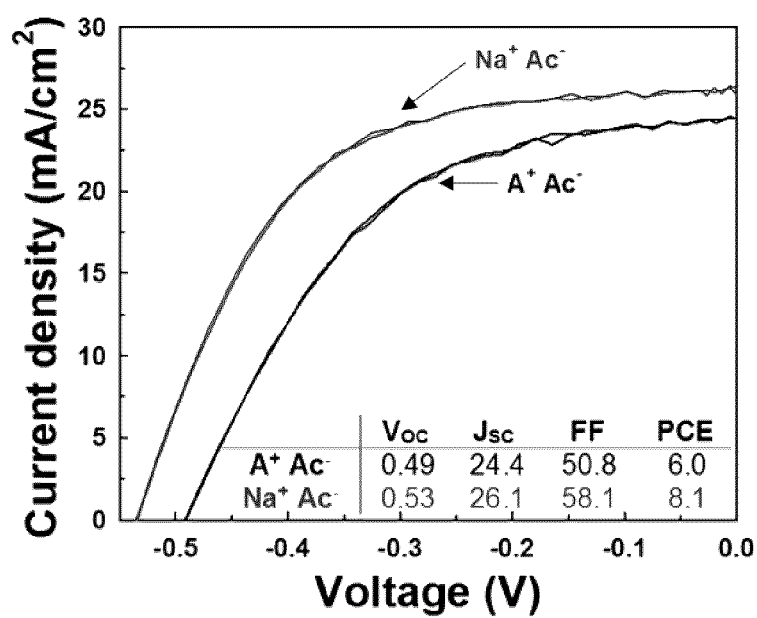

The inventors pursued enhanced photovoltaic performance from narrow-bandgap nanocrystals prepared via the facet-specific passivation strategy disclosed herein and fabricated solar cell devices using spin-coated layers of lead halide-exchanged nanocrystals with and without Na-passivation on (100), which are spin-coated onto ZnO-coated ITO electrodes as an electron-transporting layer (ETL), completing device fabrication with a thin layer of 1,2-ethanedithiol (EDT)-treated nanocrystals (EDT-nanocrystals) as a hole-transporting layer (HTL) and gold deposition as a top metal electrode (FIG. 11A). Current density-voltage (J-V) curves for each device were measured under AM1.5-simulatated full solar illumination (FIG. 11B). The photovoltaic parameters of nanocrystal solar cells made using the facet-specific passivation strategy are significantly improved, leading to 8% increase in $V_{OC}$, 7% increase in $J_{SC}$, 14% increase in fill factor (FF), and overall a 33% increase in PCE compared to the best-performing nanocrystal solar cells fabricated using conventional lead halide-only passivation.

Figure 11C:
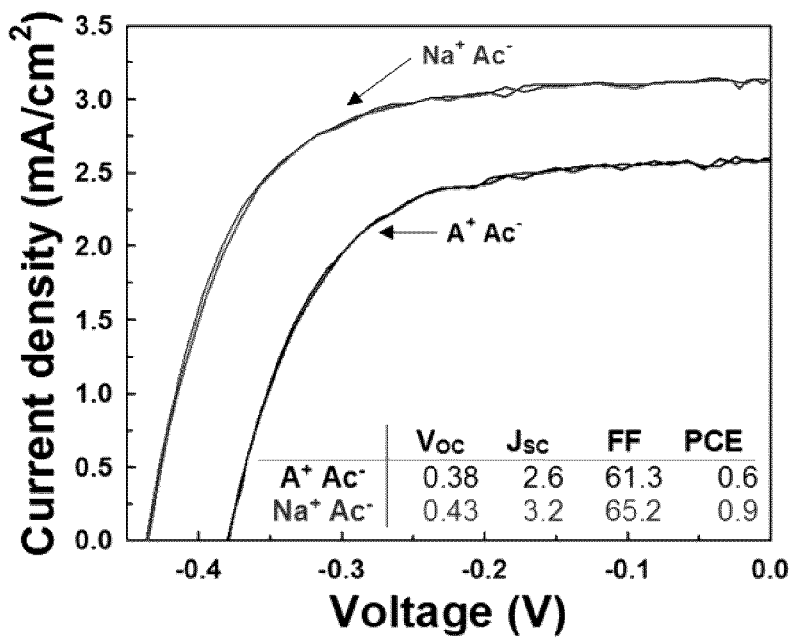

The inventors measured solar cell devices under filtered AM1.5 illumination (i.e., beyond 1100 nm), mimicking the effect of absorption by a front wide-bandgap solar cells. This allowed to examine light harvesting capability in the IR region unharvested by silicon. We used an 1100 nm long-pass filter to emulate a silicon front cell and applied a correction factor to account for differences between the lamp and the full AM1.5 spectra[17,18]. The photovoltaic performance of each device after 1100 nm long-pass filter reveals that facet-specific passivation leads to 13% increase in $V_{OC}$, 21% increase in $J_{SC}$, 6% increase in FF, and consequently 48% increase in final PCE of best-performing device compared to lead halide-only passivation (FIG. 11C).

Figure 11D:
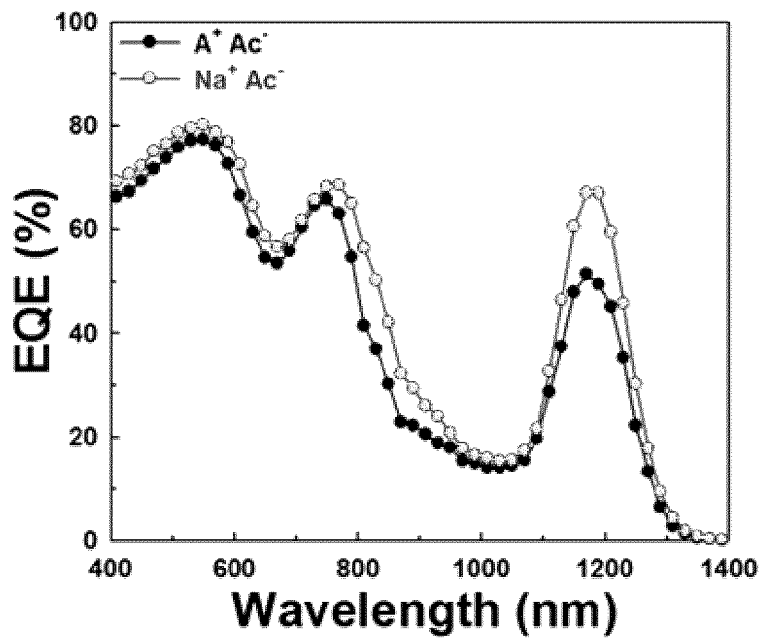
Figure 12:
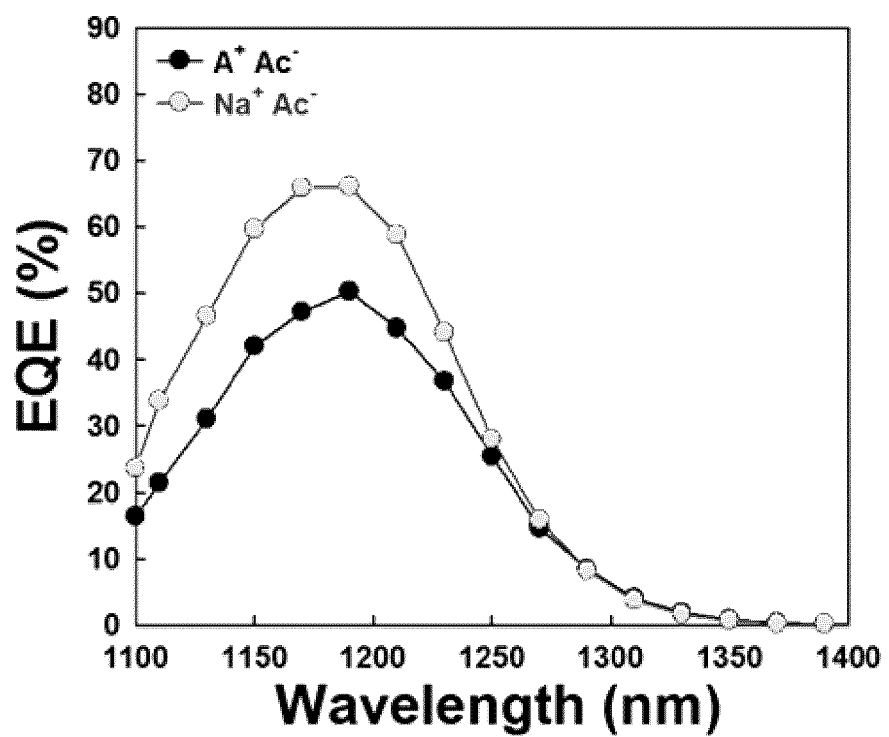
FIG. 12 shows EQE spectra for each solar cell device measured from 1100 nm to 1400 nm.

The external quantum efficiency (EQE) spectra further confirm the benefits of facet-specific passivation (FIG. 11D). A significant increase of dually-passivated nanocrystals beyond 1100 nm, with an expected $J_{SC}$ of 3.0±0.2 mA/cm$^2$ and an EQE at the exciton peak of ~70%, is obtained. This is in contrast to lead halide-only passivated devices (2.5±0.1 mA/cm$^2$ and 50%) (FIG. 12). The expected $J_{SC}$ of lead halide-only and dual-passivated nanocrystal solar cell devices are measured to be 23.8±0.6 and 25.7±0.4 mA/cm$^2$ for the full solar spectrum, in agreement with measured $J_{SC}$ values under AM1.5.

Figure 13A:
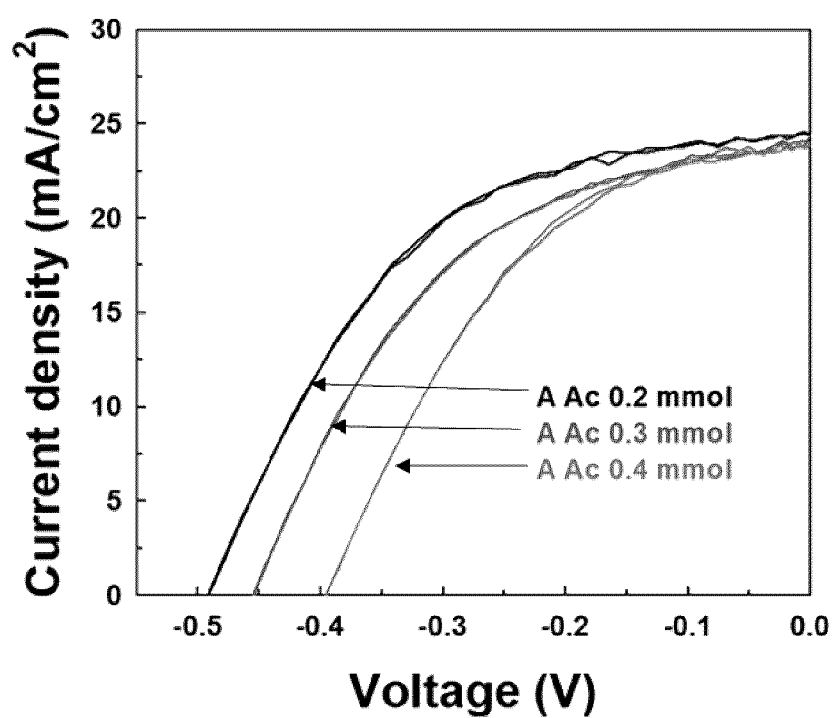
FIG. 13A shows J-V characteristic of solar cell devices fabricated using the lead halide-only passivated nanocrystals with different amount of ammonium acetate under AM1.5 simulated full solar illumination.
Figures 13B, 13C:
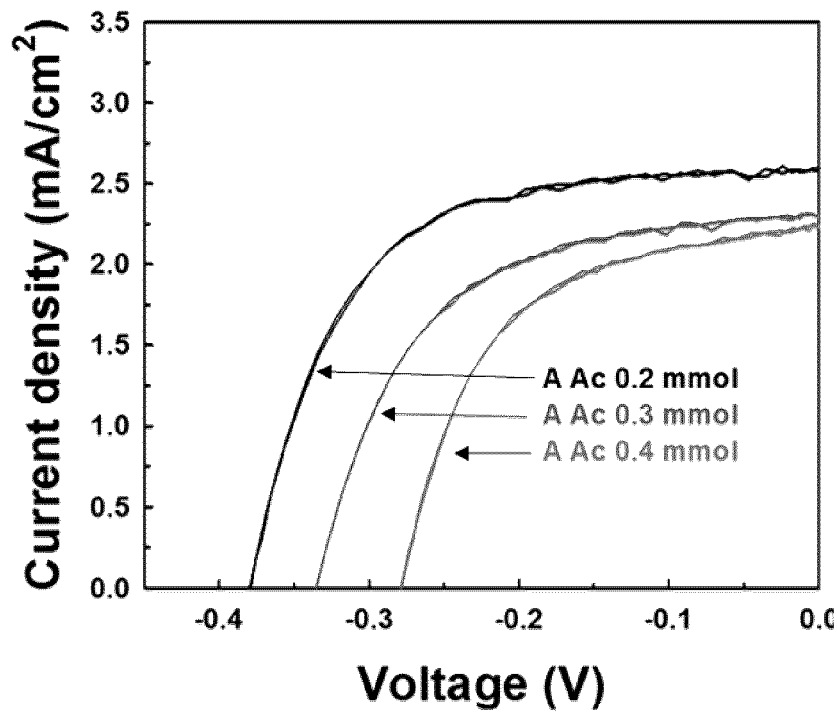
FIG. 13B shows J-V characteristic of solar cell devices fabricated using the lead halide-only passivated nanocrystals with different amount of ammonium acetate after using a silicon solar cell representative filter (long-pass 1100 nm filter)
FIG. 13C is a table giving device performance parameters with and without long-pass 1100 nm filter.
Figure 14:
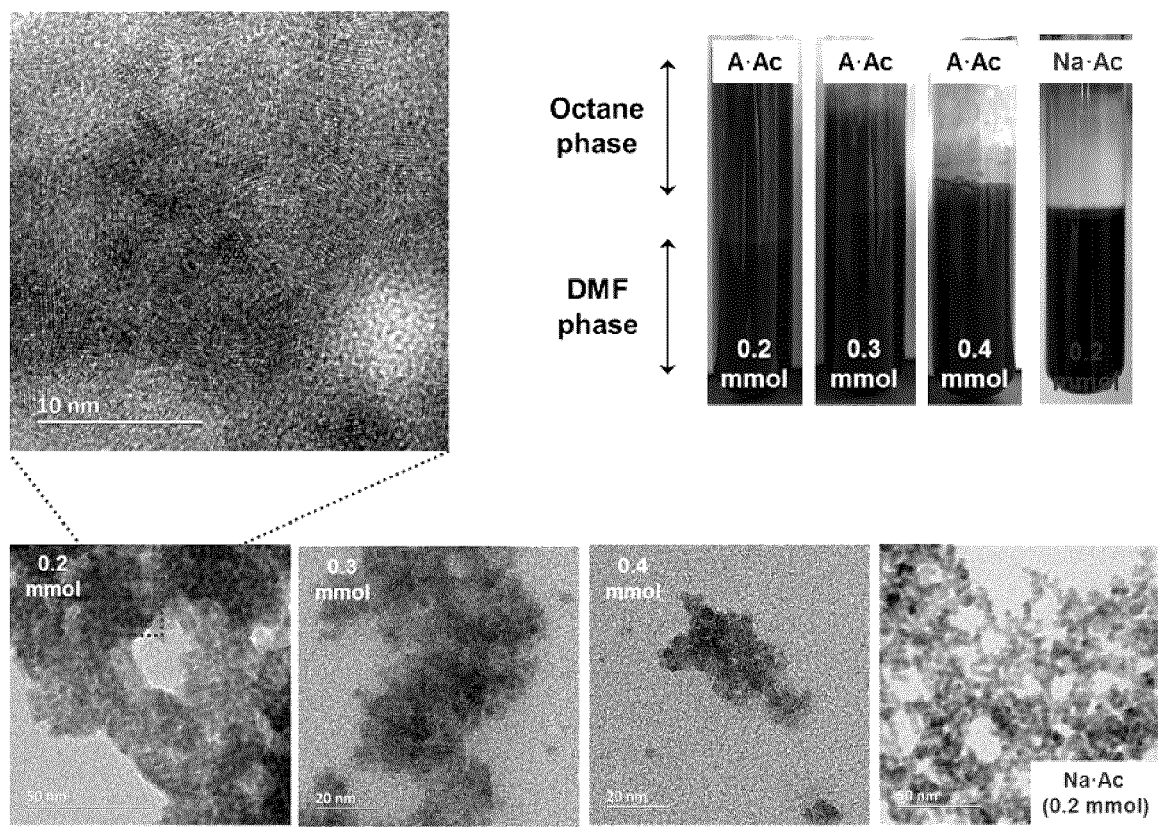
FIG. 14 shows photo and HR-TEM images of lead halide-only, followed conventional ligand exchange with increasing the amount of ammonium acetate, and dual passivated with 0.2 mmol sodium acetate nanocrystal solids, HR-TEM images for PbS nanocrystals were measured using Hitachi HF3300 equipped with Bruker EDX detector.
Figure 15A:
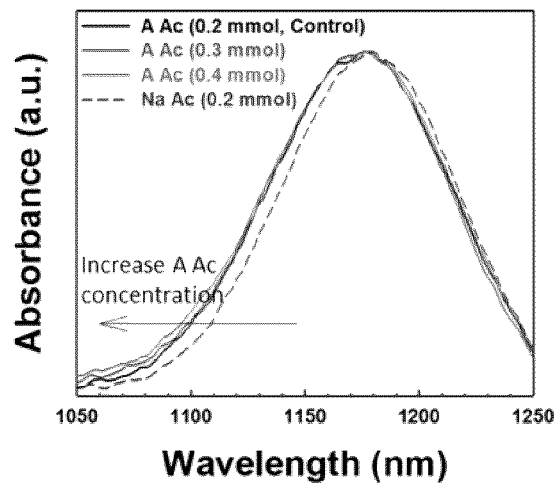
FIG. 15A shows absorbance of lead halide-only with different amount of ammonium acetate and dual passivated with 0.2 mmol sodium acetate nanocrystal solids.
Figure 15B:
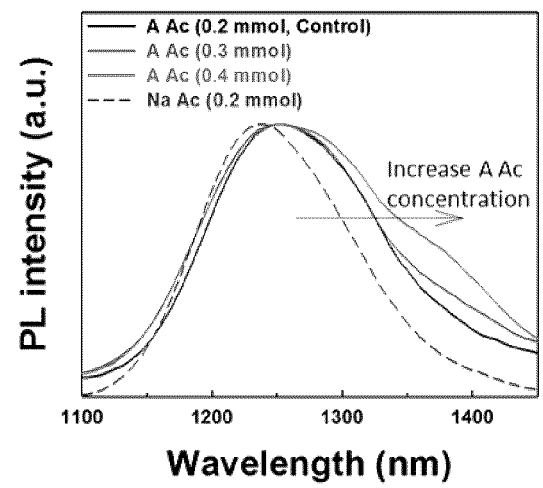
FIG. 15B shows photoluminescence (PL) spectra of lead halide-only with different amount of ammonium acetate and dual passivated with 0.2 mmol sodium acetate nanocrystal solids.

The inventors characterized the photovoltaic performance of nanocrystal solar cells based on the lead halide-only passivated nanocrystal inks prepared using different concentrations of $NH_4^+ \cdot Ac^-$ in the ligand exchange solution. As the amount of $NH_4^+ \cdot Ac^-$ increases, narrow-bandgap nanocrystals show phase-separation during the solution ligand exchange. In other words, more $NH_4^+$ in the polar solvent produces, better stabilization on the colloidal phase[29,35]. However, too larger amount of $NH_4^+ \cdot Ac^-$ results in nanocrystal fusion, which we attribute to the effect of $NH_4^+$ on the surface. The nanocrystals suffer from the elimination of Pb-oleate itself from the surface and then are fused[21,37,38]. As a result, photovoltaic parameters decrease with increased $NH_4^+ \cdot Ac^-$ for the same thickness of active layer film (FIGS. 13A, 13B and 13C). This agrees with the findings that absorption and PL spectra peaks become broader upon nanocrystal fusion (FIGS. 14, 15A and 15B).

This example demonstrates facet-specific passivation implemented in a solution-phase ligand exchange process, enabling well-passivated and colloidally-stable nanocrystal inks. The Na cation selectively passivates nonpolar (100) facets that had previously been left unaddressed, and generates facet-specific passivation on both polar (111) and nonpolar (100) facets in ligand-exchanged nanocrystals. The approach enabled protection against nanocrystal aggregation during and following ligand exchange and led to improved photophysical properties. The dually-passivated nanocrystal solids prepared via the facet-specific strategy show improved solar cell performance under AM1.5 full solar spectrum (33% increase in PCE) and beyond 1100 nm (48% increase in PCE), with ~70% EQE at the excitonic peak. Since the surface structure of colloidal nanocrystals varies with crystal size, the approach provides a means to achieve further improvements in nanocrystal-based devices.

REFERENCES

1. Puntes, V. F., Krishnan, K. M., Alivisatos, A. P. Colloidal nanocrystal shape and size control: The case of cobalt. *Science* 291, 2115-2117 (2001).
2. Daniel, M.-C., Astruc, D. Gold nanoparticles: Assembly, supramolecular chemistry, quantum-size-related properties, and applications toward biology, catalysis, and nanotechnology. *Chem. Rev.* 104, 293-346 (2004).
3. Wang, X., Zhuang, J., Peng Q., Li Y. A general strategy for nanocrystal synthesis. *Nature* 437, 121-124 (2005).
4. Park, J. et al. Synthesis of monodisperse spherical nanocrystals. *Angew. Chem. Int. Ed.* 46, 4630-4660 (2007).
5. Kim, Y et al. Nucleophilic substitution reaction based layer-by-layer growth of superparamagnetic nanocomposite films with high nonvolatile memory performance. *Adv. Mater.* 22, 5140-5144 (2010).
6. Polking, M. J. et al. Ferroelectric order in individual nanometre-scale crystals. *Nat. Mater.* 11, 700-709 (2012).
7. Gordon, T. R. et al. Nonaqueous synthesis of $TiO_2$ nanocrystals using $TiF_4$ to engineer morphology, oxygen vacancy concentration, and photocatalytic activity. *J. Am. Chem. Soc.* 134, 6751-6761 (2012).
8. Yang, T.-H., Gilroy, K. D., Xia, Y. Reduction rate as a quantitative knob for achieving deterministic synthesis of colloidal metal nanocrystals. *Chem. Sci.* 8, 6730-6749 (2017).
9. Fan, F. et al. Continuous-wave lasing in colloidal quantum dot solids enabled by facet-selective epitaxy. *Nature* 544, 75-79 (2017)
10. Colvin, V. L., Schlamp, M. C., Alivisatos, A. P. Light-emitting diodes made from cadmium selenide nanocrystals and a semiconducting polymer. *Nature* 370, 354-357 (1994).
11. Bae, W. K. et al. R/G/B/natural white light thin colloidal quantum dot-based light-emitting devices *Adv. Mater.* 26, 6387-6393 (2014).
12. Gong, X. et al. Highly efficient quantum dot near-infrared light-emitting diodes. *Nat. Photonics* 10, 253-257 (2016).
13. Konstantatos, G. et al. Ultrasensitive solution-cast quantum dot photodetectors. *Nature* 442, 180-183 (2006).
14. Lee, J.-S. et al. Band-like transport, high electron mobility and high photoconductivity in all-inorganic nanocrystal arrays. *Nat. Nanotech.* 6, 348-352 (2011).
15. Hines, M. A., Scholes, G. D. Colloidal PbS nanocrystals with size-tunable near-infrared emission: Observation of post-synthesis self-narrowing of the particle size distribution. *Adv. Mater.* 15, 1844-1849 (2003).

16. Chuang, C.-H. M., Brown, P. R., Bulović, V., Bawendi, M. G. Improved performance and stability in quantum dot solar cells through band alignment engineering. *Nat. Mater.* 13, 796-801 (2014).
17. Ip, A. H. et al. Infrared colloidal quantum dot photovoltaics via coupling enhancement and agglomeration suppression. *ACS Nano* 9, 8833-8842 (2015).
18. Kiani, A. et al. Single-step colloidal quantum dot films for infrared solar harvesting. *Appl. Phys. Lett.* 109, 183105 (2016).
19. Moreels, I., Fritzinger, B., Martins, J. C., Hens, Z. Surface chemistry of colloidal PbSe nanocrystals. *J. Am. Chem. Soc.* 130, 15081-15086 (2008).
20. Dong, A. et al. A generalized ligand-exchange strategy enabling sequential surface functionalization of colloidal nanocrystals. *J. Am. Chem. Soc.* 133, 998-1006 (2011).
21. Anderson, N. C., Hendricks, M. P., Choi, J. J., Owen, J. S. Ligand exchange and the stoichiometry of metal chalcogenide nanocrystals: Spectroscopic observation of facile metal-carboxylate displacement and binding. *J. Am. Chem. Soc.* 135, 18536-18548 (2013).
22. Choi, H., Ko, J.-H., Kim, Y.-H., Jeong, S. Steric-hindrance-driven shape transition in PbS quantum dots: Understanding size-dependent stability. *J. Am. Chem. Soc.* 135, 5278-5281 (2013).
23. Zherebetskyy, D. et al. Hydroxylation of the surface of PbS nanocrystals passivated with oleic acid. *Science* 344, 1380-1384 (2014).
24. Zhang, H., Jang, J., Liu, W., Talapin, D. V. Colloidal nanocrystals with inorganic halide, pseudohalide, and halometallate ligands. *ACS Nano* 8, 7359-7369 (2014).
25. Liu, M. et al. Hybrid organic-inorganic inks flatten the energy landscape in colloidal quantum dot solids. *Nat. Mater.* 16, 258-264 (2016).
26. Kim, Y. et al. Nanoimprint-transfer-patterned solids enhance light absorption in colloidal quantum dot solar cells. *Nano Lett.* 17, 2349-2353 (2017).
27. Baumgardner, W. J., Whitham, K., Hanrath, T. Confined-but-Connected Quantum Solids via Controlled Ligand Displacement. *Nano Lett.* 13, 3225-3231 (2013).
28. Balazs, D. M. et al. Counterion-mediated ligand exchange for PbS colloidal quantum dot superlattices. *ACS Nano* 9, 11951-11959 (2015).
29. Walravens, W. et al. Chemically triggered formation of two-dimensional epitaxial quantum dot superlattices. *ACS Nano* 10, 6861-6870 (2016).
30. Geuchies, J. J. et al. In situ study of the formation mechanism of two-dimensional superlattices from PbSe nanocrystals. *Nat. Mater.* 15, 1248-1254 (2016).
31. Salis, A., Ninham, B. W. Models and mechanisms of Hofmeister effects in electrolyte solutions, and colloid and protein systems revisited. *Chem. Soc. Rev.* 43, 7358-7377 (2014).
32. Kresse, G., Hefner, J. Ab initio molecular dynamics for liquid metals. *Phys. Rev. B* 47, 558-561 (1993).
33. Kresse, G., Furthmüller, J. Efficiency of ab-initio total energy calculations for metals and semiconductors using a plane-wave basis set. *Comput. Mat. Sci.* 6, 15-50 (1996).
34. Köhler, L., Kresse, G. Density functional study of CO on Rh(111). *Phys. Rev. B* 70, 165405 (2004).
35. Pal, D., Stoleru, V. G., Towe, E., Firsov, D. Quantum dot-size variation and its impact on emission and absorption characteristics: An experimental and theoretical modeling investigation. *Jpn. J. Appl. Phys.* 41, 482-489 (2002).
36. Gao, J., Johnson, J. C. Charge trapping in bright and dark states of coupled PbS quantum dot films. *ACS Nano* 6, 3292-3303 (2012).
37. John, S. Theory of electron band tails and Urbach optical-absorption edge. *Phys. Rev. Lett.* 57, 1777-1780 (1986).
38. Venkateshvaran, D. et al. Approaching disorder-free transport in high-mobility conjugated polymers. *Nature* 515, 384-388 (2014).
39. Kim, Y. et al. Efficient luminescence from perovskite quantum dot solids. *ACS Appl. Mater. Interfaces* 7, 25007-25013 (2015).
40. Yassitepe, E. et al. Amine-Free Synthesis of Cesium Lead Halide Perovskite Quantum Dots for Efficient Light-Emitting Diodes. *Adv. Funct. Mater.* 26, 8757-8763 (2016).

Therefore what is claimed is:

1. A dual-passivated colloidal nanocrystal comprising at least two distinct classes of crystal facets exposed at an outer surface thereof, wherein a first class of crystal facets is substantially nonpolar, and wherein a second class of crystal facets is polar, wherein the substantially nonpolar facet is passivated by an alkali metal and the polar facet passivated by at least one halide.

2. The dual-passivated colloidal nanocrystal according to claim 1, wherein said first class of crystal facets is substantially neutral in addition to being substantially nonpolar, and wherein said second class of crystal facets is substantially non-neutral in addition to being polar.

3. The dual-passivated colloidal nanocrystal according to claim 1, wherein said alkali metal is any one or combination of lithium, sodium, potassium, rubidium and cesium.

4. The dual-passivated colloidal nanocrystal according to claim 1, wherein said alkali metal is sodium.

5. The dual-passivated colloidal nanocrystal according to claim 1, wherein said halide is any one or combination of bromine, iodine and chlorine.

6. The dual-passivated colloidal nanocrystal according to claim 1, wherein said halide is a mixture of bromine and iodine.

7. The dual-passivated colloidal nanocrystal according to claim 1, wherein said halide is iodine.

8. The dual-passivated colloidal nanocrystal according to claim 1, wherein said colloidal nanocrystal is any one or combination of lead sulfide (PbS), lead selenide (PbSe) and lead telluride (PbTe).

9. The dual-passivated colloidal nanocrystal according to claim 8, wherein said colloidal nanocrystal is PbS, and has a size in a range from about 3 to about 10 nanometers.

10. The dual-passivated colloidal nanocrystal according to claim 1, wherein said non-polar facet is the (100) crystal facet, and wherein the polar facet is the (111) crystal facet.

11. A method of facet-selective passivation on each crystal facet of colloidal nanocrystals by solution-phase ligand exchange to produce the dual-passivated colloidal nanocrystal as defined in claim 1, comprising:
   a) providing colloidal nanocrystals having one or more types of ligands attached to an outer surface of said colloidal nanocrystals, the outer surface having at least two distinct crystal facets exposed at the outer surface of the colloidal nanocrystals, one of said exposed crystal facets being a neutral and non-polar facet, at least another of said exposed crystal facets being a non-neutral and polar facet,
   dispersing the colloidal nanocrystals having one or more types of ligands attached to an outer surface in an organic solvent;

b) synthesizing dual passivated colloidal nanocrystals by dissolving solutions of metal halides and alkali metal salt complexed with a moiety selected to enhance removal of original ligands on the outer surface of the colloidal nanocrystal in a solvent to produce a precursor solution, the solvent being selected to be immiscible with the organic solvent;

adding the colloidal nanocrystals dispersed in the organic solvent to the precursor solution to form a phase separated mixture comprised of the colloidal nanocrystals dispersed in the organic solvent and the precursor solution;

c) inducing transfer of the colloidal nanocrystals from the organic phase to the precursor solution phase by mixing the mixture such that the ligands are stripped from the outer surface of the colloidal nanocrystal and alkali metal passivates the neutral and non-polar crystal facet, and halide passivates the non-neutral and polar crystal facet thereby producing dual-passivated colloidal nanocrystals;

d) washing the dual-passivated colloidal nanocrystals in the precursor solvent with an organic solvent in order to remove any residual original ligands thereby; and e) precipitating the dual-passivated colloidal nanocrystals by adding an anti-solvent and drying the precipitated dual-passivated colloidal nanocrystals.

12. The method according to claim 11, further comprising a step of re-dispersing the dual-passivated colloidal nanocrystals in a solvent after step e).

13. The method according to claim 11, wherein said alkali metals is any one or combination of lithium, sodium, potassium, rubidium and cesium.

14. The method according to claim 11, wherein said alkali metal is sodium.

15. The method according to claim 11, wherein said halide is any one or combination of bromine, iodine and chlorine.

16. The method according to claim 11, wherein said halide is a mixture of bromine and iodine.

17. The method according to claim 11, wherein said halide is iodine.

18. The method according to claim 11, wherein said colloidal nanocrystal is any one of lead sulfide (PbS), lead selenide (PbSe) and lead telluride (PbTe).

19. The method according to claim 18, wherein said colloidal nanocrystal is PbS, and has a size in a range from about 3 to about 10 nanometers.

20. The method according to claim 11, wherein said non-polar crystal facet is the (100) crystal facet, and wherein the polar crystal facet is the (111) crystal facet.

21. The method according to claim 11, wherein said alkali metal salt is alkali metal acetate.

22. The method according to claim 11, wherein said colloidal nanocrystal is PbS colloidal nanocrystals, the method comprising:

a) providing PbS colloidal nanocrystals having one or more types of ligands attached to an outer surface of said PbS colloidal nanocrystals, the outer surface having at least two distinct crystal facets exposed at the outer surface of the PbS colloidal nanocrystal, one of said exposed crystal facets being a neutral and non-polar facet, at least another of said exposed crystal facets being a non-neutral and polar facet, dispersing the PbS colloidal nanocrystals having one or more types of ligands attached to an outer surface in an organic solvent;

b) synthesizing dual passivated PbS colloidal nanocrystals by dissolving solutions of metal halides and alkali metal salt complexed with a moiety selected to enhance removal of original ligands on the outer surface of the PbS colloidal nanocrystals in a solvent to produce a precursor solution, the solvent being selected to be immiscible with the organic solvent;

adding the PbS colloidal nanocrystals dispersed in the organic solvent to the precursor solution to form a phase separated mixture comprised of the PbS colloidal nanocrystals dispersed in the organic solvent and the precursor solution;

c) inducing transfer of the PbS colloidal nanocrystals from the organic phase to the precursor solution phase by mixing the mixture such that the ligands are stripped from the outer surface of the PbS colloidal nanocrystal and the alkali metal passivates the neutral and non-polar crystal facet, and halide passivates the non-neutral and polar crystal facet thereby producing dual-passivated PbS colloidal nanocrystals;

d) washing the dual-passivated PbS colloidal nanocrystals in the precursor solvent with an organic solvent in order to remove any residual original ligands thereby; and e) precipitating the dual-passivated PbS colloidal nanocrystals by adding an anti-solvent and drying the precipitated dual-passivated PbS colloidal nanocrystals.

23. The method according to claim 22 wherein the step b) of synthesizing dual passivated PbS colloidal nanocrystals includes dissolving solutions of lead iodide ($PbI_2$), lead bromide ($PbBr_2$) and sodium acetate ($Na^+ \cdot Ac^-$) in dimethylformamide to produce a precursor solution, and mixing the PbS colloidal nanocrystals dispersed in the organic solvent with the precursor solution to form a mixture such that a dimethylformamide phase forms along with an organic solvent phase.

* * * * *